(12) United States Patent
Bai et al.

(10) Patent No.: US 12,501,708 B2
(45) Date of Patent: Dec. 16, 2025

(54) DISPLAY PANEL, ARRAY SUBSTRATE AND METHOD FOR PREPARING SAME

(71) Applicants: BEIJING BOE DISPLAY TECHNOLOGY CO., LTD., Beijing (CN); BOE TECHNOLOGY GROUP CO., LTD., Beijing (CN)

(72) Inventors: Jinchao Bai, Beijing (CN); Bo Liu, Beijing (CN); Xiangqian Ding, Beijing (CN); Hui Guo, Beijing (CN); Yihe Jia, Beijing (CN); Yanxin Ji, Beijing (CN); Yue Liu, Beijing (CN)

(73) Assignees: BEIJING BOE DISPLAY TECHNOLOGY CO., LTD., Beijing (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 438 days.

(21) Appl. No.: 18/016,471

(22) PCT Filed: Mar. 31, 2022

(86) PCT No.: PCT/CN2022/084485
§ 371 (c)(1),
(2) Date: Jan. 17, 2023

(87) PCT Pub. No.: WO2023/184374
PCT Pub. Date: Oct. 5, 2023

(65) Prior Publication Data
US 2024/0258337 A1    Aug. 1, 2024

(51) Int. Cl.
*H10D 86/60*    (2025.01)
*G02F 1/1362*    (2006.01)
(Continued)

(52) U.S. Cl.
CPC ....... *H10D 86/60* (2025.01); *G02F 1/136295* (2021.01); *G02F 1/1368* (2013.01);
(Continued)

(58) Field of Classification Search
None
See application file for complete search history.

(56) References Cited

U.S. PATENT DOCUMENTS 9,971,219 B1    5/2018  Liu et al.
12,117,700 B2 *  10/2024  Xu ...................... G02F 1/13452
(Continued)

FOREIGN PATENT DOCUMENTS

CN    20020040404 A    2/2002
CN    1920663 A    2/2007
(Continued)

OTHER PUBLICATIONS

Written Opinion from PCT/CN2022/084485 dated Dec. 28, 2022.
Written Opinion from PCT/CN2022/115817 dated Dec. 30, 2022.

*Primary Examiner* — Bo B Jang
(74) *Attorney, Agent, or Firm* — Calfee, Halter & Griswold LLP

(57) ABSTRACT

An array substrate includes a base substrate, a driving circuit layer with a first pillow body on a peripheral region of the array substrate, an organic thin film layer and a conductive layer sequentially stacked; the first pillow body includes a first pillow metal block located on at least one of a source drain metal layer and a gate layer and a first pillow insulating layer covering the first pillow metal block; the organic thin film layer is defined with a barrier groove on the peripheral region, the first pillow body is provided with a part covered by the organic thin film layer and the other part exposed by the barrier groove; the conductive layer is provided with a signal wire passing across an edge of the barrier groove, and (Continued)

an edge of the signal wire at least partially overlaps with the first pillow body.

20 Claims, 20 Drawing Sheets

(51) Int. Cl.
    *G02F 1/1368*     (2006.01)
    *H10D 86/01*     (2025.01)
    *H10D 86/40*     (2025.01)

(52) U.S. Cl.
    CPC ......... *H10D 86/021* (2025.01); *H10D 86/443* (2025.01); *H10D 86/451* (2025.01)

(56) References Cited

U.S. PATENT DOCUMENTS

| | | |
|---|---|---|
| 2002/0048834 A1 | 4/2002 | French et al. |
| 2014/0027791 A1 | 1/2014 | Cho et al. |
| 2017/0200750 A1 | 7/2017 | Liu et al. |
| 2018/0180945 A1 | 6/2018 | Shim |
| 2020/0258958 A1 | 8/2020 | Gai et al. |
| 2021/0358956 A1 | 11/2021 | Ma et al. |
| 2024/0152010 A1* | 5/2024 | Gong ................ G02F 1/136209 |

FOREIGN PATENT DOCUMENTS

| | | |
|---|---|---|
| CN | 104465652 A | 3/2015 |
| CN | 104952882 A | 9/2015 |
| CN | 105206618 A | 12/2015 |
| CN | 105514033 A | 4/2016 |
| CN | 107219658 A | 9/2017 |
| CN | 206657159 U | 11/2017 |
| CN | 107507840 A | 12/2017 |
| CN | 108010945 A | 5/2018 |
| CN | 108241227 A | 7/2018 |
| CN | 108447872 A | 8/2018 |
| CN | 109410751 A | 3/2019 |
| CN | 109411619 A | 3/2019 |
| CN | 111352531 A | 6/2020 |
| CN | 109360840 B | 11/2020 |
| CN | 111933674 A | 11/2020 |
| CN | 111952323 A | 11/2020 |
| CN | 112018159 A | 12/2020 |
| CN | 112259564 A | 1/2021 |
| CN | 113053766 A | 6/2021 |
| CN | 113327942 A | 8/2021 |
| CN | 114089869 A | 2/2022 |
| EP | 3694010 A1 | 8/2020 |
| EP | 3767673 A1 | 1/2021 |
| JP | 2002040404 A | 2/2002 |
| JP | 2004335848 A | 11/2004 |
| JP | 2005352354 A | 12/2005 |
| JP | 2010282111 A | 12/2010 |
| JP | 20100282111 A | 12/2010 |
| KR | 2001001526 A | 3/2001 |

\* cited by examiner a driving circuit layer is formed on a side of the base substrate, and the driving circuit layer is provided with a first pillow body on a peripheral region of the array substrate; the first pillow body includes a first pillow metal block located on at least one of a source drain metal layer and a gate layer, and a first pillow insulating layer covers the first pillow metal block — S110 an organic thin film layer and a conductive layer are sequentially formed on a side of the driving circuit layer away from the base substrate. The organic thin film layer is defined with a barrier groove on the peripheral region, and a part of the first pillow body is covered by the organic thin film layer and the other part of the first pillow body is exposed by the barrier groove; the conductive layer is provided with a signal wire that passes across an edge of the barrier groove, and an edge of the signal wire at least partially overlaps with the first pillow body — S120

FIG. 13

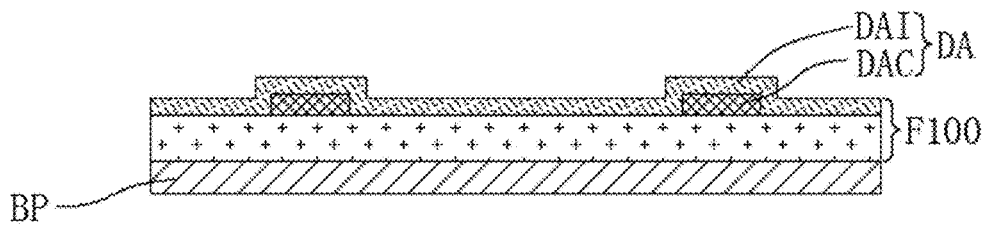

FIG. 14

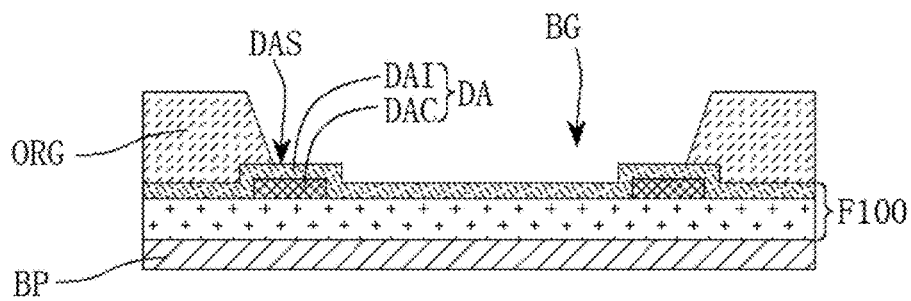

FIG. 15

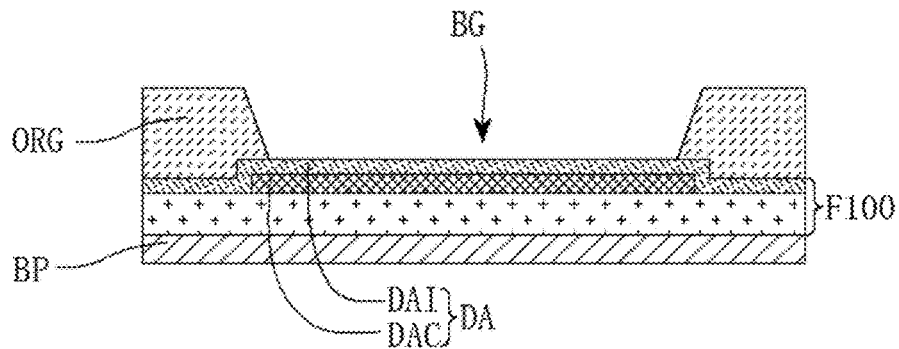

FIG. 28

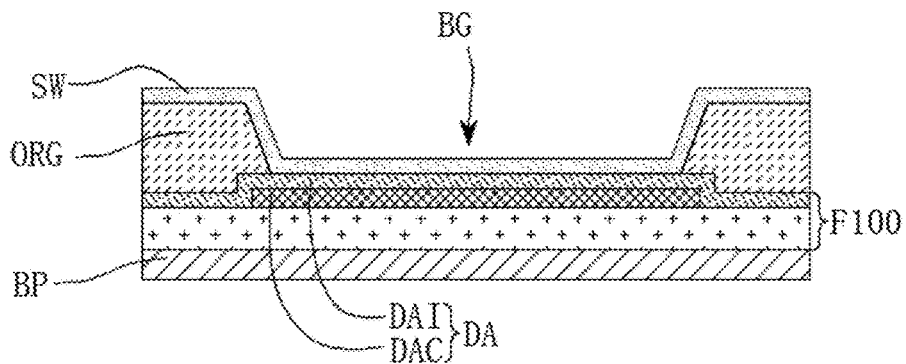

FIG. 29

| a driving circuit layer is formed on a side of the base substrate. The driving circuit layer is provided with a switch wire on a peripheral region of the array substrate. The switch wire is located on at least one of the source drain metal layer and the gate layer. | S210 |

| the organic thin film layer and the conductive layer are sequentially formed on a side of the driving circuit layer away from the base substrate. The organic thin film layer is defined with a barrier groove and a via hole exposing the switch wire on the peripheral region. At least a part of the switch wire passes across the barrier groove. The conductive layer is provided with signal wires separated by an edge of the barrier groove, and the adjacent two ends of the signal wires are electrically connected through the switch wire. The signal wire and the switch wire are connected through the via hole | S220 |

FIG. 30

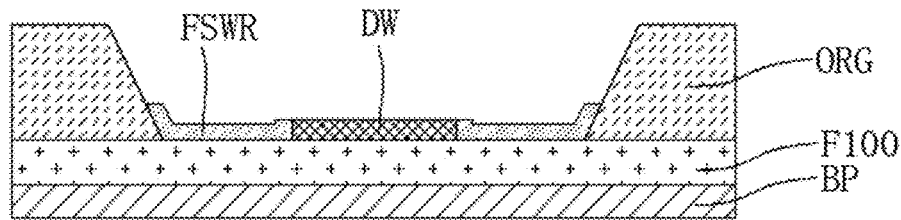

FIG. 40 a driving circuit layer is formed on a side of the base substrate. The driving circuit layer is provided with a second pillow body and a conductive structure on a peripheral region of an array substrate. The second pillow body includes a second pillow metal block located on the gate layer and a second pillow insulating layer covering the second pillow metal block. The conductive structure is located on a side of the second pillow body away from the base substrate, and at least partially overlaps with the second pillow body —S310 an organic thin film layer and a conductive layer are sequentially formed on a side of the driving circuit layer away from the base substrate. The organic thin film layer is defined with a barrier groove on the peripheral region, and at least a part of the second pillow body and at least a part of the conductive structure are exposed by the barrier groove. The part of the conductive structure exposed by the barrier groove is completely carried on the second pillow body. —S320

FIG. 41

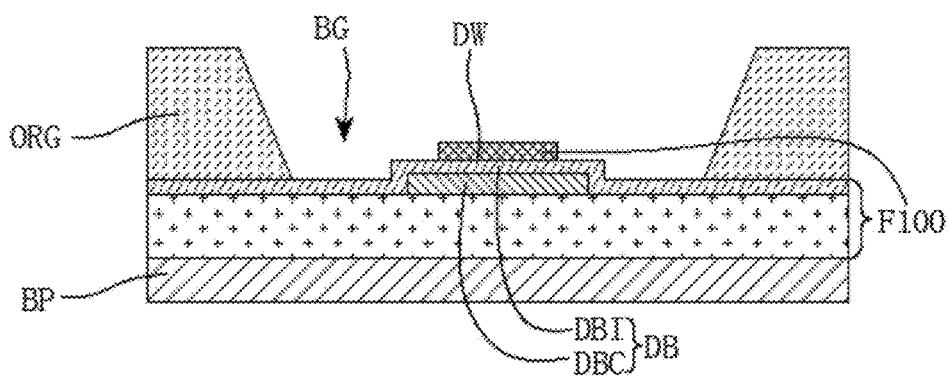

FIG. 42

DISPLAY PANEL, ARRAY SUBSTRATE AND METHOD FOR PREPARING SAME

The present application is a U.S. National Stage of International Application No. PCT/CN2022/084485, filed on Mar. 31, 2022, the entire content of which is incorporated herein by reference for all purposes. No new matter has been introduced.

TECHNICAL FIELD

The present disclosure relates to a field of display technology, and more particularly to a display panel, an array substrate and a method for preparing the array substrate.

BACKGROUND

In a display panel, the organic thin film layer has characteristics of small dielectric constant and relatively high smoothness, which may reduce power consumption of the display panel and enhance a display contrast, such that an organic thin film layer is more and more widely used in the display panel. Since the organic thin film layer is prone to absorbing water, the organic thin film layer needs to be defined with a barrier groove on a peripheral region of the display panel. However, when a conductive layer is prepared on the organic thin film layer, short-circuit defects of the display panel in the barrier groove often occur.

It should be noted that the information disclosed in the above background section is only for enhancing the understanding of the BACKGROUND of the present disclosure, and thus may include information that does not constitute the prior art known to those of ordinary skill in the art.

SUMMARY

The present disclosure aims to overcome shortcomings of the above prior art, and a display panel, an array substrate and a method for preparing the array substrate are provided, so as to reduce short-circuit defects in the barrier groove.

According to a first aspect of the present disclosure, an array substrate is provided and includes a base substrate, a driving circuit layer, an organic thin film layer and a conductive layer sequentially stacked;
  the driving circuit layer is provided with a first pillow body on a peripheral region of the array substrate; the first pillow body includes a first pillow metal block located on at least one of a source drain metal layer and a gate layer and a first pillow insulating layer covering the first pillow metal block;
  the organic thin film layer is defined with a barrier groove on the peripheral region, a part of the first pillow body is covered by the organic thin film layer and the other part of the first pillow body is exposed by the barrier groove;
  the conductive layer is provided with a signal wire passing across an edge of the barrier groove, and an edge of the signal wire at least partially overlaps with the first pillow body.

According to an embodiment of the present disclosure, in at least a partial region of the barrier groove, two edges of the barrier groove are provided with a plurality of the first pillow bodies, respectively;
  each of two edges of a same signal wire overlaps with two adjacent first pillow bodies, and the signal wire covers a gap between the two adjacent first pillow bodies.

According to an embodiment of the present disclosure, in at least a partial region of the barrier groove, each of two edges of the barrier groove is provided with one first pillow body, and the signal wire intersects with the first pillow body.

According to an embodiment of the present disclosure, in at least a partial region of the barrier groove, a plurality of first pillow bodies are provided; two ends of any one of the first pillow bodies are covered by the organic thin film layers at two sides of the barrier groove, respectively; each of two edges of the signal wire at least partially overlaps with two adjacent first pillow bodies, and the signal wire covers a gap between the two adjacent first pillow bodies.

According to an embodiment of the present disclosure, in at least a partial region of the barrier groove, there is one first pillow body and two sides of the first pillow body are covered by the organic thin film layers at two sides of the barrier groove, respectively; a part of the signal wire on a bottom surface of the barrier groove is at least partially carried on the first pillow body.

According to an embodiment of the present disclosure, the driving circuit layer is provided with a ground wire on the peripheral region, and the ground wire at least partially overlaps with the barrier groove;
  at least a part of the first pillow metal block is a part of the ground wire.

According to an embodiment of the present disclosure, the driving circuit layer is provided with a ground wire on the peripheral region, and the ground wire at least partially overlaps with the barrier groove;
  a position of the signal wire passing across the edge of the barrier groove does not overlap with the ground wire.

According to an embodiment of the present disclosure, a size of the part of the first pillow body covered by the organic thin film layer is not less than 2 microns along an extension direction perpendicular to the barrier groove.

According to an embodiment of the present disclosure, a height of the first pillow body protruding from a bottom of the barrier groove is greater than or equal to 10% of a depth of the barrier groove.

According to a second aspect of the present disclosure, a method for preparing an array substrate is provided and includes:
  forming a driving circuit layer on a side of a base substrate, wherein the driving circuit layer is provided with a first pillow body on a peripheral region of the array substrate;
  the first pillow body includes a first pillow metal block located on at least one of a source drain metal layer and a gate layer and a first pillow insulating layer covering the first pillow metal block;
  sequentially forming an organic thin film layer and a conductive layer on a side of the driving circuit layer away from the base substrate; wherein the organic thin film layer is defined with a barrier groove on the peripheral region, a part of the first pillow body is covered by the organic thin film layer and the other part of the first pillow body is exposed by the barrier groove; the conductive layer is provided with a signal wire passing across an edge of the barrier groove, and an edge of the signal wire at least partially overlaps with the first pillow body.

According to an embodiment of the present disclosure, in at least a partial region of the barrier groove, two edges of the barrier groove are provided with a plurality of the first pillow bodies, respectively;

each of two edges of a same signal wire overlaps with two adjacent first pillow bodies, and the signal wire covers a gap between the two adjacent first pillow bodies.

According to an embodiment of the present disclosure, in at least a partial region of the barrier groove, each of two edges of the barrier groove is provided with one first pillow body, and the signal wire intersects with the first pillow body.

According to an embodiment of the present disclosure, in at least a partial region of the barrier groove, there is a plurality of first pillow bodies; two ends of any one of the first pillow bodies are covered by the organic thin film layers at two sides of the barrier groove, respectively; each of two edges of the signal wire at least partially overlaps with two adjacent first pillow bodies, and the signal wire covers a gap between the two adjacent first pillow bodies.

According to an embodiment of the present disclosure, in at least a partial region of the barrier groove, there is one first pillow body and two sides of the first pillow body are covered by the organic thin film layers at two sides of the barrier groove, respectively; a part of the signal wire on a bottom surface of the barrier groove is at least partially carried on the first pillow body.

According to a third aspect of the present disclosure, an array substrate is provided and includes a base substrate, a driving circuit layer, an organic thin film layer and a conductive layer sequentially stacked;

the driving circuit layer is provided with a switch wire on a peripheral region of the array substrate, and the switch wire is located on at least one of a source drain metal layer and a gate layer;

the organic thin film layer is defined with a barrier groove and a via hole exposing the switch wire on the peripheral region; at least a part of the switch wire passes across the barrier groove; the conductive layer is provided with signal wires separated by an edge of the barrier groove, and adjacent two ends of the signal wires are electrically connected through the switch wire; and each signal wire and the switch wire are connected through the via hole.

According to an embodiment of the present disclosure, at least a part of the switch wire passes across the barrier groove, and each of two ends of the switch wire is exposed by the via hole;

at least a part of signal wire is separated by the barrier groove, and the adjacent two ends of the signal wires are connected to the two ends of the switch wire through the via hole, respectively.

According to an embodiment of the present disclosure, the conductive layer further includes a conductive material in the barrier groove, the conductive material is located at the edge of the barrier groove, and disconnected from the signal wires.

According to a fourth aspect of the present disclosure, a method for preparing an array substrate is provided and includes:

forming a driving circuit layer on a side of a base substrate, wherein the driving circuit layer is provided with a switch wire on a peripheral region of the array substrate, and the switch wire is located on at least one of a source drain metal layer and a gate layer;

sequentially forming an organic thin film layer and a conductive layer on a side of the driving circuit layer away from the base substrate; wherein the organic thin film layer is defined with a barrier groove and a via hole exposing the switch wire on the peripheral region; at least a part of the switch wire passes across the barrier groove; the conductive layer is provided with signal wires separated by an edge of the barrier groove, and adjacent two ends of the signal wires are electrically connected through the switch wire; and each signal wire and the switch wire are connected through the via hole.

According to a fifth aspect of the present disclosure, an array substrate is provided and includes a base substrate, a driving circuit layer, an organic thin film layer and a conductive layer sequentially stacked;

the driving circuit layer is provided with a second pillow body and a conductive structure on a peripheral region of the array substrate; the second pillow body includes a second pillow metal block located on a gate layer and a second pillow insulating layer covering the second pillow metal block; the conductive structure is located on a side of the second pillow body away from the base substrate, and the conductive structure at least partially overlaps with the second pillow body;

the organic thin film layer is defined with a barrier groove on the peripheral region, at least a part of the second pillow body and at least a part of the conductive structure are exposed by the barrier groove; the part of the conductive structure exposed by the barrier groove is completely carried on the second pillow body.

According to an embodiment of the present disclosure, there is a gap between an edge of the part of the conductive structure exposed by the barrier groove and an edge of the second pillow body.

According to an embodiment of the present disclosure, the conductive layer includes a conductive material in the barrier groove, the conductive material is located between an edge of the second pillow body and an edge of the barrier groove, and the conductive material is disconnected from the conductive structure.

According to a sixth aspect of the present disclosure, a method for preparing the array substrate is provided and includes:

forming a driving circuit layer on a side of a base substrate, wherein the driving circuit layer is provided with a second pillow body and a conductive structure on a peripheral region of the array substrate; the second pillow body includes a second pillow metal block located on a gate layer and a second pillow insulating layer covering the second pillow metal block; the conductive structure is located on a side of the second pillow body away from the base substrate, and the conductive structure at least partially overlaps with the second pillow body;

sequentially forming an organic thin film layer and a conductive layer on a side of the driving circuit layer away from the base substrate; wherein the organic thin film layer is defined with a barrier groove on the peripheral region, at least a part of the second pillow body and at least a part of the conductive structure are exposed by the barrier groove; the part of the conductive structure exposed by the barrier groove is completely carried on the second pillow body.

According to an embodiment of the present disclosure, there is a gap between an edge of the part of the conductive structure exposed by the barrier groove and an edge of the second pillow body.

According to a seventh aspect of the present disclosure, a method for preparing an array substrate is provided and includes:

forming an organic thin film layer on a side of a base substrate, wherein the organic thin film layer is defined with a barrier groove on a peripheral region;

forming a conductive material layer on a side of the organic thin film layer away from the base substrate, wherein the conductive material layer covers the organic thin film layer and the barrier groove;

coating photoresist on a side of the conductive material layer away from the base substrate, wherein the photoresist covers the organic thin film layer and fills the barrier groove;

exposing the photoresist, wherein a focus plane of an exposure machine is below a surface of the photoresist;

removing the photoresist after etching the conductive material layer.

According to an eighth aspect of the present disclosure, a display panel is provided and includes the above array substrate.

According to an embodiment of the present disclosure, the display panel further includes a cover plate opposite to the array substrate, and a frame sealant provided between the array substrate and the cover plate; the frame sealant covers the barrier groove;

the driving circuit layer is provided with a conductive wire overlapping with the frame sealant on the peripheral region, and the conductive wire is designed in a grid manner.

It should be understood that the preceding general description and the following detailed description are exemplary and explanatory only and are not restrictive of the disclosure.

BRIEF DESCRIPTION OF THE DRAWINGS

The accompanying drawings here are incorporated in the specification and constitute a part of this specification, show embodiments in accordance with the present disclosure and serve to explain the principles of the present disclosure together with the specification. Obviously, the drawings in the following description are only some embodiments of the present disclosure, and for those ordinary skills in the art, other drawings can also be obtained from these drawings without creative efforts.

FIG. 2-1 shows a top structural view of a display panel in an embodiment of the present disclosure.

FIG. 2-2 shows a top structural view of a display panel in an embodiment of the present disclosure.

FIG. 2-3 shows a top structural view of a display panel in an embodiment of the present disclosure.

FIG. 3 shows a sectional structural view of an array substrate in an embodiment of the present disclosure.

FIG. 6-1 shows a partial structural view of an array substrate at a top corner in an embodiment of the present disclosure.

FIG. 6-2 shows a structural view of a sub structure of a composite electrode layer of an array substrate in an embodiment of the present disclosure.

FIG. 13 shows a flow diagram of a method for preparing an array substrate in an embodiment of the present disclosure.

FIG. 14 shows a structural view of a driving circuit layer with a first pillow body in an embodiment of the present disclosure.

FIG. 15 shows a structural view of an organic thin film layer formed on a side of a driving circuit layer away from a base substrate in an embodiment of the present disclosure.

FIG. 28 shows a sectional structural view at M4-M4' in FIG. 27.

FIG. 29 shows a sectional structural view at N4-N4' in FIG. 27.

FIG. 30 shows a flow diagram of a method for preparing an array substrate in an embodiment of the present disclosure.

FIG. 37-1 shows a structural view of an organic thin film layer formed on a driving circuit layer provided with a conductive structure in the related art, in which at least a part of the conductive structure is exposed by a barrier groove.

FIG. 37-2 shows a structural view of a conductive material layer formed on an organic thin film layer in the related art.

FIG. 40 shows a structural view of a short circuit between conductive structures caused by insufficient etching of a conductive material layer in a barrier groove in the related art.

FIG. 41 shows a flow diagram of a method for preparing an array substrate in an embodiment of the present disclosure.

FIG. 42 shows a structural view of a driving circuit layer and an organic thin film layer formed in an embodiment of the present disclosure, in which the driving circuit layer is provided with a second pillow body and a conductive structure.

DETAILED DESCRIPTION

Figure 1:
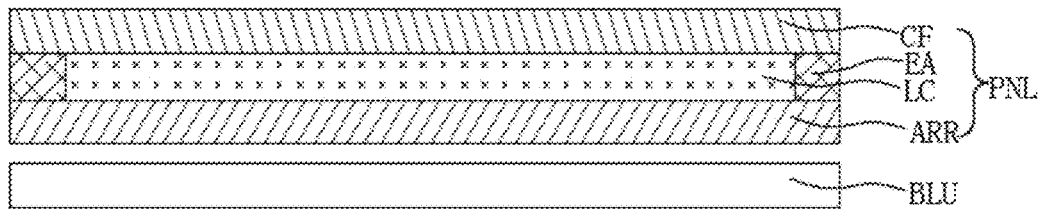
FIG. 1 shows a sectional structural view of a display panel in an embodiment of the present disclosure.

Example embodiments will now be described more fully with reference to the accompanying drawings. However, the example embodiments can be implemented in various forms and should not be construed as limited to the embodiments set forth herein; rather, these embodiments are provided such that the disclosure will be more thorough and complete, and will fully convey the concept of the example embodiments to those skilled in the art. The same reference numerals in the drawings denote the same or similar structures, and thus their detailed descriptions will be omitted. In addition, the accompanying drawings are only schematic illustrations of the present disclosure and are not necessarily drawn to scale.

Although relative terms such as "up" and "down" are used in this specification to describe the relative relationship between one component illustrated in the drawings and another component, these terms are used in this specification for convenience only, for example, according to the illustrative direction depicted in the drawings. It can be understood that if the device illustrated in the drawings is inversed and turned upside down, the component described "above" would become the component "below". Other relative terms, such as "high", "low", "top", "bottom", "left", "right", and the like, also have similar meanings. When a structure is "on" other structure(s), it may mean that the structure is integrally formed on the other structure(s), or that the structure is "directly" arranged on the other structure(s), or that the structure is "indirectly" arranged on other structure (s) through another structure.

The terms "a", "an" and "the" are used to indicate the presence of one or more elements/components/etc.; and the terms "comprising" and "including" are used to mean open-ended inclusion and mean that there may be other elements/components/etc. besides the listed elements/components/etc., and the terms "first" "second", "third", and the like are used only as markers, and not as restrictions on the number of objects.

The embodiment of the present disclosure provides an array substrate of a display panel and a method for preparing the array substrate to avoid or reduce short-circuit defects in the barrier groove.

Figures 1, 2:
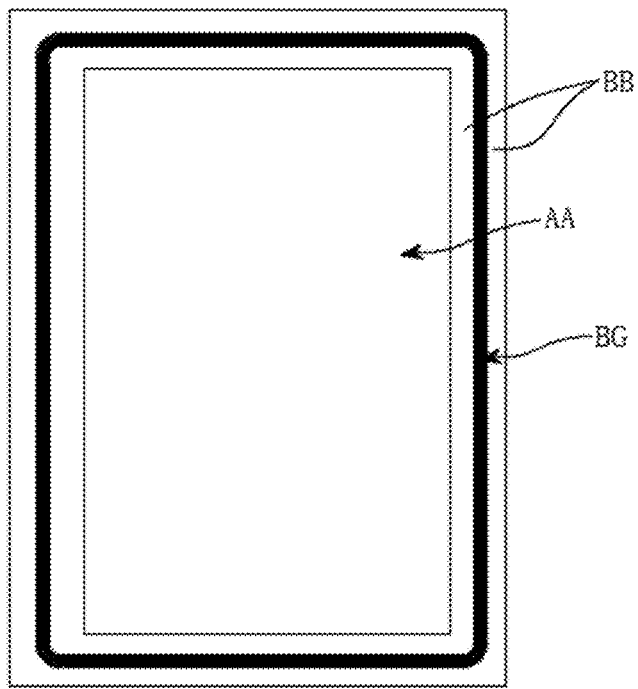
Figure 2:
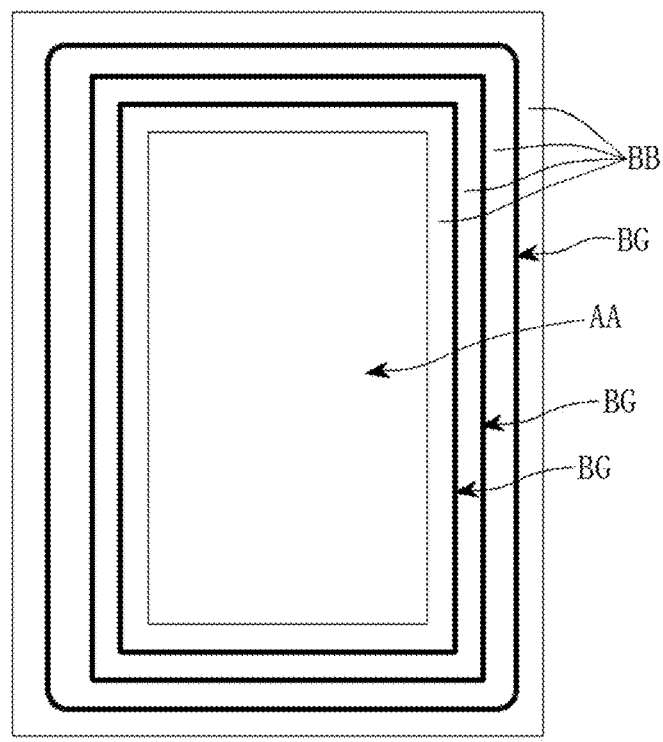
Figures 2, 3:
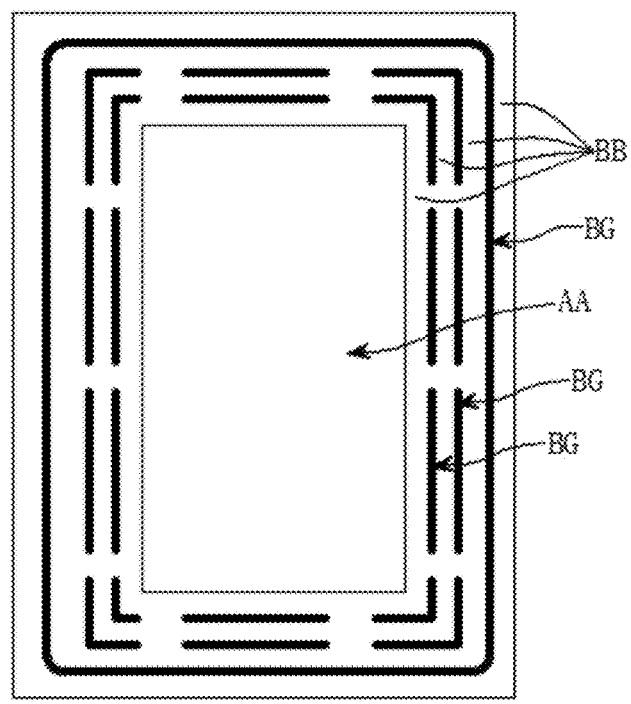
Figure 3:
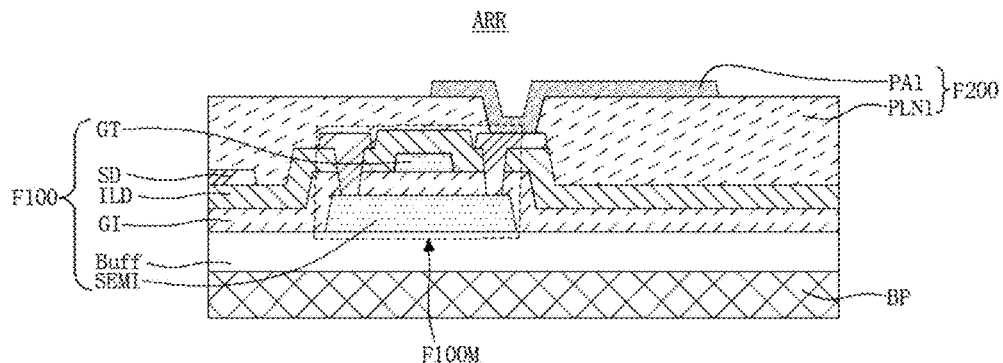

As shown in FIG. 1, as shown from a stacked structure, the display panel PNL in the embodiment of the present disclosure may include an array substrate ARR, an adhesive layer EA and a cover plate CF. As shown in FIGS. 2-1 to 2-3, as shown from a plane structure, the array substrate ARR includes a display region AA configure for display and a peripheral region BB surrounding the display region AA. An organic thin film layer ORG is arranged on the array substrate ARR, and the peripheral region BB is defined with a barrier groove BG opened towards a cover plate CF direction. The adhesive layer EA fills the barrier groove BG, which on the one hand obstructs the intrusion route of water vapor, and on the other hand improves the adhesion between the adhesive layer EA and the array substrate ARR.

For example, as shown in FIG. 1, the display panel PNL is a liquid crystal display panel. A color film base substrate of the liquid crystal display panel may serve as the cover plate CF, and a frame sealant of the liquid crystal display panel may serve as the adhesive layer EA. A liquid crystal cell surrounded by the frame sealant is provided between the color film base substrate and the array substrate ARR, and the liquid crystal cell is filled with liquid crystal LC. The organic thin film layer ORG on the array substrate ARR is defined with a barrier groove BG on the peripheral region BB. When the array substrate ARR is connected to the color film base substrate to form a cell through the frame sealant, the frame sealant may fill the barrier groove BG, which may, on the one hand, obstruct a path from which the water vapor enters, and on the other hand, increase a bonding area between the array substrate ARR and the frame sealant, thereby improving the adhesion between the array substrate ARR and the frame sealant, and overcoming the problem of easy peeling between the array substrate ARR and the frame sealant caused by the organic thin film layer ORG.

Of course, the display panel PNL of the present disclosure may also be a display panel of other types, such as a display panel with self-luminous elements. The luminous elements and a pixel driving circuit driving the luminous elements may be arranged on the array substrate ARR of the display panel PNL. On a light exit side of the array substrate ARR, a light transmission cover plate CF, such as a glass cover, may be attached through the frame sealant or optical adhesive. For example, the display panel PNL may also be an OLED (organic light-emitting diode) display panel, a PLED (polymer organic light-emitting diode) display panel, a Micro LED (micro light-emitting diode) display panel, a QD-OLED (quantum dot organic light-emitting diode) display panel, a QLED (quantum dot light-emitting diode) display panel or other types of self-luminous display panel.

Figure 4:
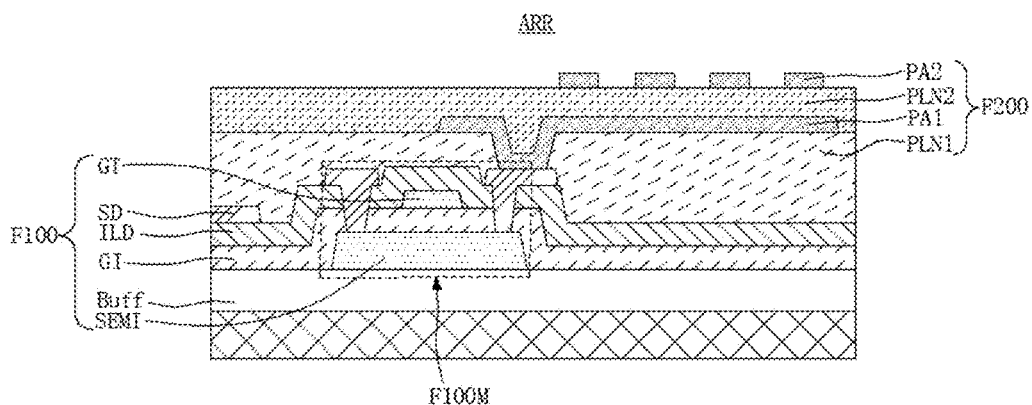
FIG. 4 shows a sectional structural view of an array substrate in an embodiment of the present disclosure.

As shown in FIGS. 3 and 4, in some embodiments, the array substrate ARR of the present disclosure may include a base substrate BP, a driving circuit layer F100, and an electrode composite layer F200 sequentially stacked. The electrode composite layer F200 is provided with a pixel electrode, and the driving circuit layer F100 is provided with a pixel driving circuit configured to drive a pixel electrode. In the self-luminous display panel, the light-emitting elements of the array substrate ARR may be arranged on the electrode composite layer F200, or the electrode composite layer F200 of the array substrate ARR may serve as a part of a light-emitting element layer. In the embodiment of the present disclosure, a structure of the display panel PNL and a method for preparing the display panel PNL in the present disclosure are illustrated by taking the display panel PNL as the liquid crystal display panel as a specific example. It may be understood that the technical means and effects that may be achieved in the exemplary description of the structure of the display panel PNL and the method for preparing the display panel PNL in the embodiments of the present disclosure may be directly or reasonably deformed and applied to the array substrate of the self-luminous display panel.

In the display panel PNL according to the embodiment of the present disclosure, the electrode composite layer F200 of the array substrate ARR at least includes one electrode layer, and at least one electrode layer serves as a pixel electrode layer. The pixel electrode layer is provided with a pixel electrode of the display panel PNL. A common electrode layer of the display panel PNL may be arranged on the array substrate ARR or the cover plate CF.

In an embodiment, as shown in FIG. 4, the electrode composite layer F200 of the array substrate ARR may include two electrode layers sequentially stacked (i.e. a first electrode layer PA1 and a second electrode layer PA2). For example, as shown in FIG. 4, the electrode composite layer F200 of the array substrate ARR includes a first planarization layer PLN1 (using an organic material), the first electrode layer PA1, an insulating dielectric layer and the second electrode layer PA2 sequentially stacked on a side of the driving circuit layer F100 away from the base substrate BP. The insulating dielectric layer may be an inorganic dielectric layer, an organic dielectric layer, or a composite laminated structure of the organic dielectric layer and the inorganic dielectric layer. As an example, as shown in FIG. 4, the insulating dielectric layer includes a second planarization layer PLN2 (using an organic material). The second planarization layer PLN2 may be directly arranged on a surface of the first electrode layer PA1 away from the base substrate BP, or the inorganic dielectric layer is arranged between the second planarization layer PLN2 and the first electrode layer PA1.

One of the first electrode layer PA1 and the second electrode layer PA2 is a common electrode layer provided with a common electrode, and the other is a pixel electrode layer provided with a pixel electrode. The common electrode and the pixel electrode may be respectively a plate electrode or a hollow electrode (such as a slot electrode) independent from each other.

For example, in an embodiment of the present disclosure, as shown in FIG. 4, the first electrode layer PA1 serves as the pixel electrode layer, and the pixel electrode set therein is a plate electrode. The second electrode layer PA2 is a common electrode layer, and the common electrode set therein is a hollow electrode.

In the array substrate ARR according to the embodiment of the present disclosure, at least one of the first electrode layer PA1 and the second electrode layer PA2 is a transparent electrode layer, such as a transparent metal electrode layer (such as a magnesium silver alloy layer, an aluminum silver alloy layer, etc.) or a transparent metal oxide electrode layer (such as an indium tin oxide layer). In an example, the first electrode layer PA1 and the second electrode layer PA2 are both transparent electrode layers. For example, materials of the first electrode layer PA1 and the second electrode layer PA2 are indium tin oxide (ITO).

In another embodiment, as shown in FIG. 3, the electrode composite layer F200 of the array substrate ARR may include one electrode layer, and that is, only the first electrode layer PA1 is provided. For example, as shown in FIG. 3, the electrode composite layer F200 of the array substrate ARR includes the first planarization layer PLN1 and the first electrode layer PA1 sequentially stacked on a side of the driving circuit layer F100 away from the base substrate BP. The first electrode layer PA1 is provided with a pixel electrode as a pixel electrode layer.

In some embodiments of the present disclosure, the electrode composite layer F200 also includes an orientation layer configured to control a pre-tilt angle of liquid crystal molecules.

In some embodiments of the present disclosure, the electrode composite layer F200 also includes a support column layer, which forms a plurality of support columns to improve stability of a cell thickness of the liquid crystal cell.

In the display panel PNL according to the embodiment of the present disclosure, the base substrate BP may be a base substrate BP of an inorganic material or a base substrate BP of an organic material. For example, in an embodiment of the present disclosure, a material of the base substrate BP may be soda lime glass, quartz glass, sapphire glass and other glass material, or stainless steel, aluminum, nickel and other metal material. In another embodiment of the present disclosure, a material of the base substrate BP may be polymethyl methacrylate (PMMA), polyvinyl alcohol (PVA), polyvinyl phenol (PVP), polyether sulfone (PES), polyimide, polyamide, acetal, poly carbonate (PC), polyethylene terephthalate (PET), polyethylene naphthalate (PEN) or combinations thereof. Of course, in other embodiments of the present disclosure, such as in the self-luminous display panel PNL, the base substrate BP may also be a flexible base substrate BP. For example, the material of the base substrate BP may be polyimide (PI). The base substrate BP may also be a composite of multilayer materials. For example, in an embodiment of the present disclosure, the base substrate BP may include a bottom film layer, a pressure-sensitive adhesive layer, a first polyimide layer and a second polyimide layer sequentially stacked. It may be understood that when the liquid crystal display panel PNL of the embodiment example of the present disclosure is a transmissive liquid crystal display panel PNL, the base substrate BP uses a transparent material.

The driving circuit layer F100 of the array substrate ARR according to the embodiment of the present disclosure is provided with a pixel driving circuit configured to drive the pixel electrode of a sub-pixel. In the driving circuit layer, any pixel driving circuit may include a transistor. Further, as shown in FIGS. 3 and 4, the transistor may be a thin film transistor, and the thin film transistor may be selected from a top gate type thin film transistor, a bottom gate type thin film transistor, or a double gate type thin film transistor. An active layer material of the thin film transistor may be an amorphous silicon semiconductor material, low-temperature polycrystalline silicon semiconductor material, a metal oxide semiconductor material, an organic semiconductor material or other type of the semiconductor material. The thin film transistor may be an N-type thin film transistor or a P-type thin film transistor. In this example, the pixel driving circuit may be a switch transistor F100M.

Optionally, as shown in FIGS. 3 and 4, the driving circuit layer may include a semiconductor layer SEMI, a gate insulating layer GI, a gate layer GT, an interlayer dielectric layer ILD, a source drain metal layer SD, and the like, which are stacked between the base substrate BP and the electrode composite layer F200. The switch transistor may be formed by the semiconductor layer SEMI, the gate insulating layer GI, the gate layer GT, the interlayer dielectric layer ILD, the source drain metal layer SD and other film layers. The position relationship of each film may be determined according to a film structure of the thin film transistor. In an example, the driving circuit layer may include a semiconductor layer SEMI, a gate insulating layer GI, a gate layer GT, an interlayer dielectric layer ILD, and a source drain metal layer SD sequentially stacked, and the switch transistor thus formed is the top gate type thin film transistor. In another example, the driving circuit layer may include a gate layer GT, a gate insulating layer GI, a semiconductor layer SEMI, an interlayer dielectric layer ILD, and a source drain metal layer SD sequentially stacked, and the thin film transistor thus formed is a bottom gate type thin film transistor.

In an example, a thickness of the gate layer GT may be between 0.1 and 1 μm, such as, between 0.3 and 0.5 μm. The gate layer GT may be one metal layer (such as a copper layer), or may include multiple layers of the metal layers (such as Ti/Al/Ti, Mo/Cu/Mo, and the like) that are sequentially stacked. These metal layer may include an alloy layer, such as MoNi alloy layer, etc. Of course, in some examples, the gate layer GT may also be provided with a conductive non-metallic layer, such as a TiN layer.

In an example, a thickness of the source drain metal layer SD may be between 0.1 and 1 μm, such as between 0.3 and 0.5 μm. The source drain metal layer SD may be one metal layer (such as a copper layer), or may include multiple layers of metal layers (such as Ti/Al/Ti, Mo/Cu/Mo, and the like) that are sequentially stacked. These metal layer may include an alloy layer, such as MoNi alloy layer, etc. Of course, in some examples, the gate layer GT may also be provided with a conductive non-metallic layer, such as a TiN layer.

Figure 5:
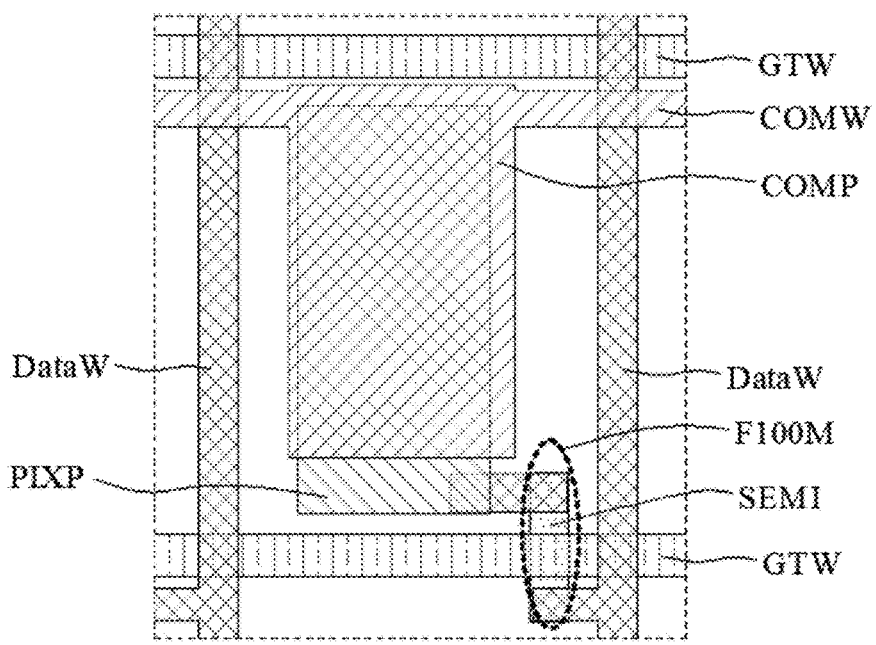
FIG. 5 shows a partial structural view of an array substrate in an embodiment of the present disclosure.

In some embodiments, as shown in FIG. 5, the driving circuit layer may be provided with a plurality of data voltage wires DataW, which may extends along a column direction as a whole. The data voltage wires DataW may be extending straight lines or zigzag lines bent back and forth in a row direction. Furthermore, the data voltage wire DataW may be arranged on the source drain metal layer.

As shown in FIG. 5, the gate layer GT is provided with a plurality of scan wires GTW. In this example, an end of the switch transistor F100M is connected to the data voltage wire DataW, the other end of the switch transistor is connected to the pixel electrode PIXP, and a gate of the switch transistor is connected to the scan wire GTW. Under control of a scan voltage loaded on the scan wire GTW, the switch transistor F100M may be turned on such that a data voltage on the data voltage wire DataW is loaded to the pixel electrode.

The scan wire GTW may extend along the row direction as a whole. The scan wire GTW may be a straight line lead in the row direction or a zigzag line bent back and forth in the column direction. The scan wire GTW and the data voltage wire DataW may be defined with a plurality of pixel regions, and the pixel electrode and the switch transistor may be arranged in the pixel regions.

In some embodiments, as shown in FIGS. 3 and 4, an active layer of the switch transistor F100M is arranged on the semiconductor layer SEMI. The active layer of the switch transistor may include a source contact region, a channel region and a drain contact region connected in sequence. The source contact region is connected to the data voltage wire DataW through a via hole, and the drain contact region is connected to the pixel electrode through a via hole. In an example, the scan wire GTW overlaps with the channel region of the switch transistor, such that a part where the scan wire GTW overlaps with the channel region of the switch transistor may serve as the gate of the switch transistor. In other examples, the switch transistor is a bottom gate type thin film transistor. A size of the part where the scan wire GTW overlaps with the channel region of the switch transistor may be partially increased, such that the scan wire GTW completely shields the channel region of the switch transistor, thereby avoiding a characteristics change, such as a leakage current increase, of the switch transistor caused by light irradiating from a side of the base substrate BP to the channel region of the switch transistor.

In some embodiments, as shown in FIG. 5, the electrode composite layer F200 of the array substrate ARR also includes a common electrode layer, which is provided with a common electrode COMP and a common electrode wire COMW connecting an adjacent common electrode COMP. Of course, in other embodiments of the present disclosure, the common electrode wire COMW may also be arranged on other film layer, such as the gate layer GT.

In some examples, the driving circuit layer may also include a passivation layer, which is arranged at a side of the source drain metal layer SD away from the base substrate BP to protect the source drain metal layer SD.

In some examples, the driving circuit layer may also include an inorganic buffer layer Buff, which is arranged on a surface of the base substrate BP. A gate layer GT, a semiconductor layer SEMI, a source drain metal layer SD, and the like are arranged on a side of the inorganic buffer layer Buff away from the base substrate BP.

In this exemplary array substrate ARR, materials of the inorganic buffer layer Buff, the passivation layer, the interlayer dielectric layer ILD and the gate insulating layer GI may be dielectric materials such as silicon oxide, silicon nitride, silicon oxynitride and the like. For example, the passivation layer and the interlayer dielectric layer ILD are made of the silicon nitride, and the inorganic buffer layer Buff and gate insulating layer GI are made of the silicon oxide.

In other embodiments of the present disclosure, the array substrate may include a base substrate BP, an electrode composite layer F200, and a driving circuit layer F100 sequentially stacked, or the driving circuit layer F100 and the electrode composite layer F200 are mixed with each other, or the driving circuit layer F100 is sandwiched between the electrode composite layers F200. For example, the array substrate ARR includes a base substrate BP, a first electrode layer PA1 and a gate layer GT, a gate insulating layer GI, a semiconductor layer SEMI, a source drain metal layer SD, a planarization layer PLN and a second electrode layer PA2, which are sequentially stacked. The first electrode layer PA1 and the gate layer GT are arranged at a same film position and adopt different materials, and the first electrode layer PA1 and the gate layer GT are two mutual nested layers. The first electrode layer PA1 and the second electrode layer PA2 serve as two electrode layers of the electrode composite layer F200, and the semiconductor layer SEMI, the source drain metal layer SD, the gate layer GT, and the like serve as a film layer of the driving circuit layer F100. In the present disclosure, these possible stacking manners of the array substrate ARR are applied to the method for preparing the array substrate ARR in the present disclosure.

Figures 1, 6:
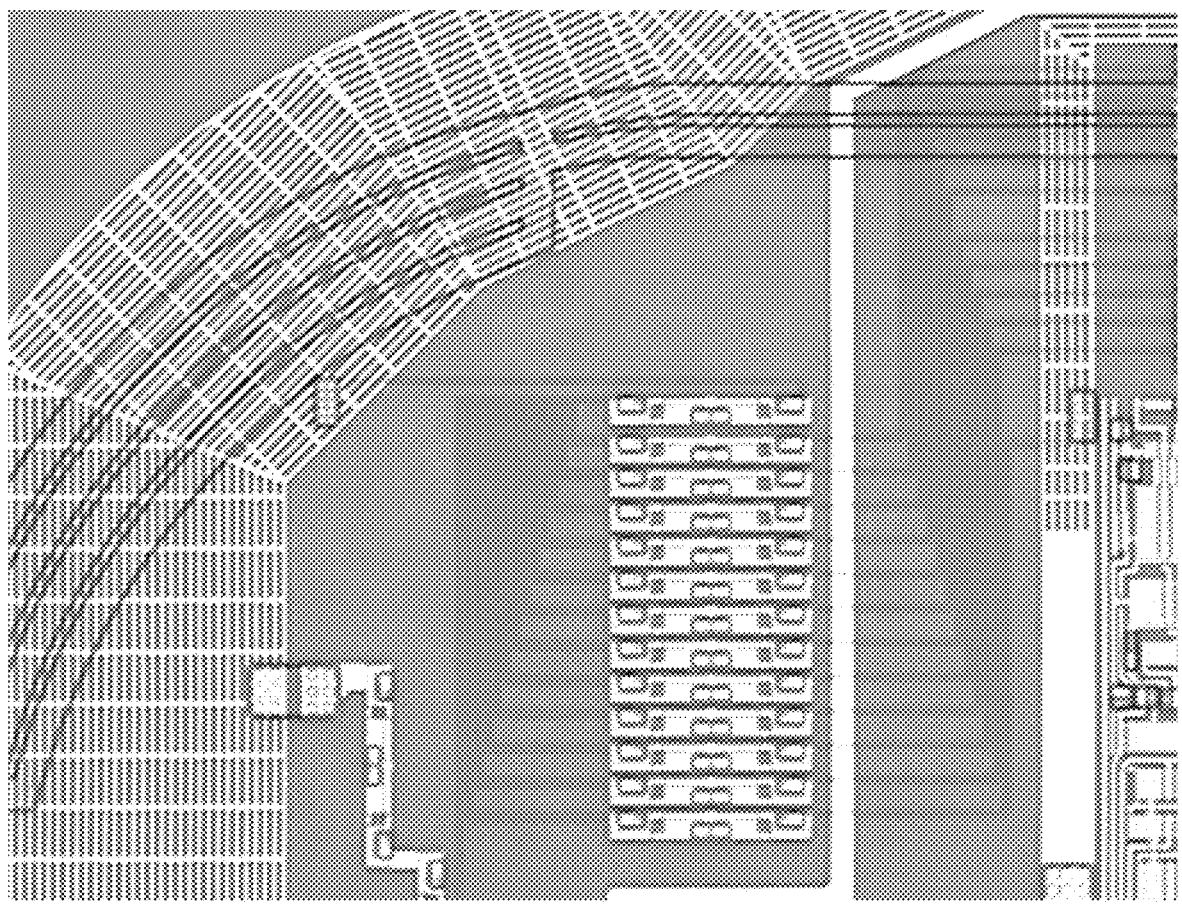
Figures 2, 6:
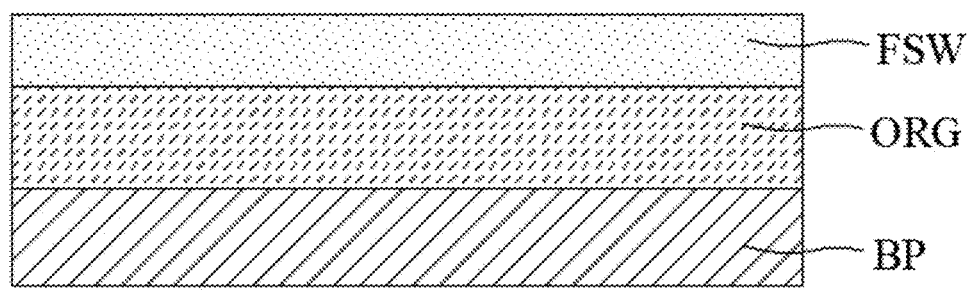

As shown in FIG. 6-2, in the array substrate ARR according to the embodiment of the present disclosure, the electrode composite layer F200 is provided with a sub structure formed by an organic thin film layer ORG and a conductive layer FSW located on a side of the organic thin film layer ORG away from the base substrate BP. For example, in an example, the electrode composite layer F200 of the array substrate ARR includes the first planarization layer PLN1 and the first electrode layer PA1 sequentially stacked, and the first planarization layer PLN1 and the first electrode layer PA1 may form a sub structure. In this sub structure, the first planarization layer PLN1 serves as the organic thin film layer ORG, and the first electrode layer PA1 serves as the conductive layer FSW. For another example, the display panel PNL includes the first planarization layer PLN1, the first electrode layer PA1, the second planarization layer PLN2, and the second electrode layer PA2 sequentially stacked, and the second planarization layer PLN2 and the second electrode layer PA2 may form a sub structure. In this sub structure, the second planarization layer PLN2 serves as the organic thin film layer ORG, and the second electrode layer PA2 serves as the conductive layer FSW. Of course, in this example, the first planarization layer PLN1 and the first electrode layer PA1 may also form a sub structure. For another example, the electrode composite layer F200 is provided with a planarization layer PLN and a second electrode layer PA2 on a side of the source drain metal layer SD away from the base substrate BP. Thus, the planarization layer PLN may serve as an organic thin film layer ORG, and the second electrode layer PA2 may serve as a conductive layer FSW.

In some embodiments of the present disclosure, a thickness of the organic thin film layer ORG may be between 0.5 and 5 microns, such as between 1.5 and 3 microns.

In some embodiments of the present disclosure, a width of the barrier groove BG formed on the organic thin film layer ORG may be between 10 and 200 microns.

In some embodiments of the present disclosure, the barrier groove BG is arranged on the peripheral region BB of the array substrate ARR, and surrounds the display region AA, for example, arranged on a sealant-coating region of the display panel PNL for coating the frame sealant.

In an example, as shown in FIG. 2-2 and FIG. 2-3, a plurality of barrier grooves BG are provided. At least a part of the barrier grooves BG surround the display region AA in sequence. Furthermore, a number of barrier grooves BG may be the same or different at different positions. For example, as shown in FIG. 6-1, four barrier grooves BG are provided at a corner of the array substrate ARR, and two barrier grooves BG are provided at a non-corner position. In this way, a sealing strength at the corner may be improved, and defects such as puncture, of the display device at the corner may be avoided.

In an example, as shown in FIG. 2-3, at least a partial region of the barrier groove BG may be designed discontinuously, and that is, the barrier groove BG may include a plurality of barrier sub grooves.

In another example, as shown in FIG. 2-1 and FIG. 2-3, at least one barrier groove BG is arranged continuously, and that is, the barrier groove is in a continuous ring shape.

Of course, in other embodiments of the present disclosure, as shown in FIG. 2-1, a number of barrier grooves of ARR on the array substrate may also be one.

In an example, in at least a partial region, a slot is defined between two adjacent barrier grooves BG, such that the two adjacent barrier grooves BG are communicated with each other.

In an example, the barrier groove BG runs through the organic thin film layer ORG along a normal direction of the array substrate ARR.

In some embodiments of the present disclosure, as shown in FIG. 6-1, the conductive layer FSW may form a signal wire SW that passes across an edge of the barrier groove BG. For example, at least one signal wire SW passes across two opposite sidewalls of the barrier groove BG (i.e., the sidewalls of the organic thin film layer ORG), or at least one signal wire SW continues to route or is stopped in the barrier groove BG after passing across one sidewall of the barrier groove BG.

For example, the signal wire SW may be a clock wire configured to transmit a clock signal. Of course, the signal wire SW may also transmit other signals.

In an example, a width of at least a part of signal wires SW ranges from 10 to 20 microns, and a gap between at least a part of signal wires SW ranges from 10 to 20 microns. Of course, in other examples of the present disclosure, the width of the signal wire SW and the gap between the signal wires SW may be set as needed. For example, the width of the at least signal wires SW may be reduced to 3 to 10 microns, or the gap between the at least a part of signal wires SW may be reduced to 3 to 10 microns.

It may be understood that the width of a same signal wire SW at different positions may be different due to reasons such as the preparation process error, the pattern difference of photoresist with different thicknesses in the same exposure during the photolithography and the like. For example, a width of the signal wire SW on a sidewall of the organic thin film layer ORG may be less than a width of the signal wire SW on a bottom of the barrier groove BG.

In some embodiments, the driving circuit layer is provided with a ground wire on the peripheral region BB. In a region where the ground wire overlaps with the frame sealant, the ground wire is designed in a grid manner to improve the light transmittance of the ground wire and facilitate the curing of the frame sealant. Furthermore, in a region where the ground wire does not overlap with the frame sealant, the ground wire may adopt a full-face structure rather than a hollow design, to reduce an impedance of the ground wire.

Figure 7:
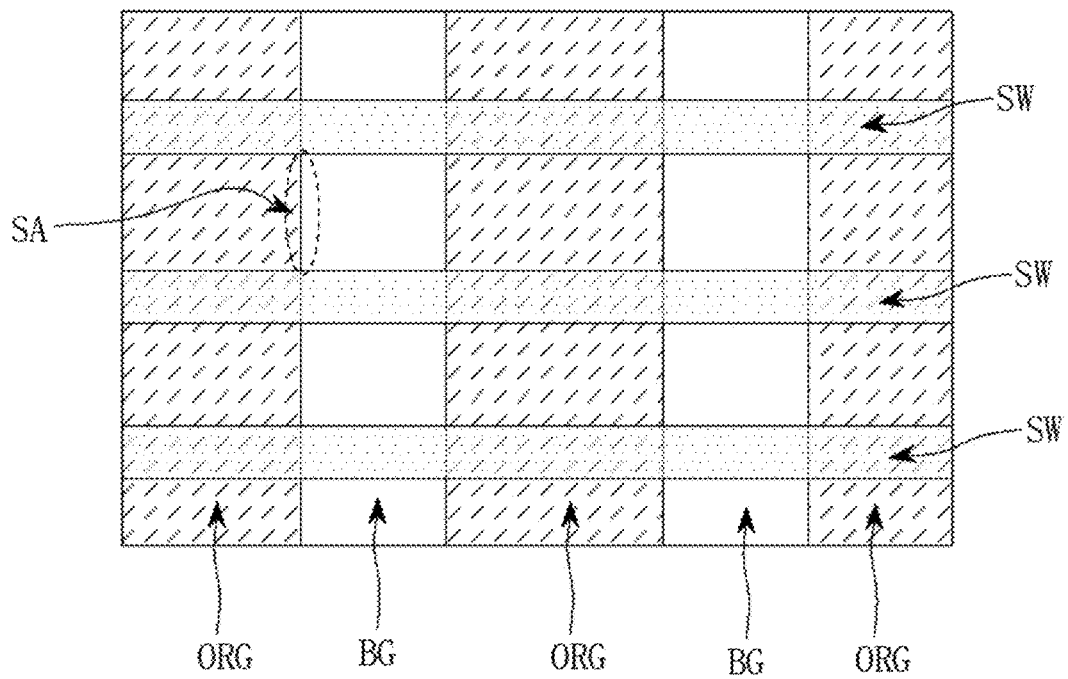
FIG. 7 shows a top structural view of an organic thin film layer and a signal wire of an array substrate in an embodiment of the present disclosure.

As shown in FIG. 7, in the related art, when the signal wire SW passes through an edge of the barrier groove BG, short-circuit defects between two adjacent signal wires SW easily occur. After analyzing such defects, it is found that the conductive material is left between the adjacent signal wires SW at an edge region SA of the barrier groove BG. The preparation process of the array substrate ARR in the related art is traced. As shown in FIGS. 8 to 12, the array substrate ARR in the related art is prepared by a method shown in steps S011 to S015 below.

Figure 8:
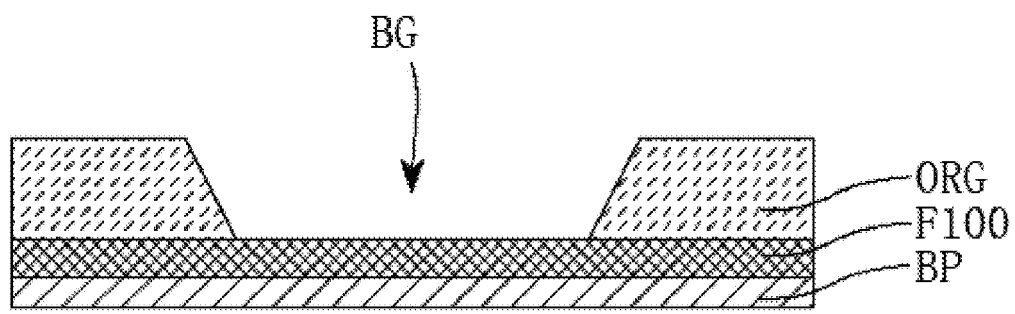
FIG. 8 shows a structural view of an organic thin film layer formed on a driving circuit layer in the related art.
Figure 9:
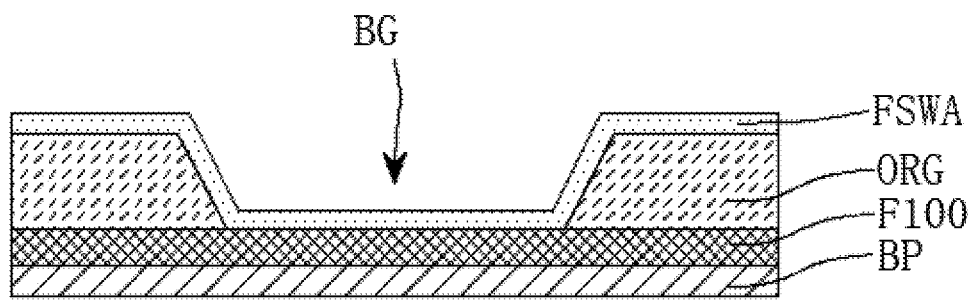
FIG. 9 shows a structural view of a conductive material layer formed on an organic thin film layer in the related art.
Figure 10:
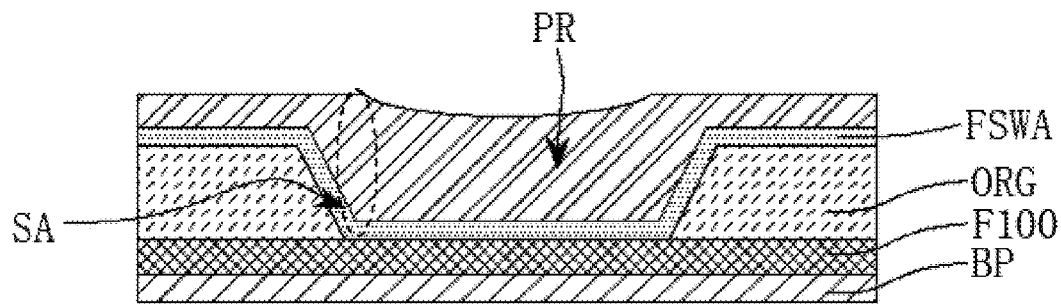
FIG. 10 shows a structural view of coating photoresist in the related art.
Figure 11:
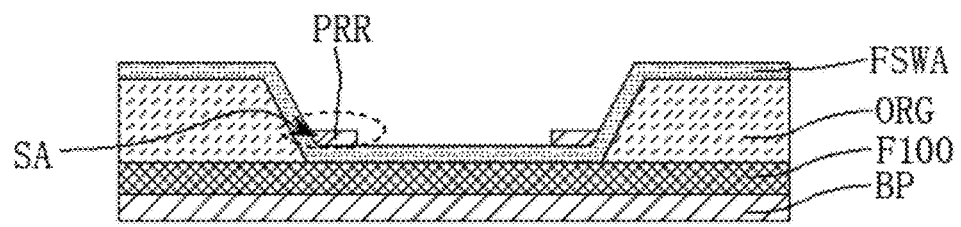
FIG. 11 shows a structural view of insufficient photoresist exposure in a barrier groove in the related art.
Figure 12:
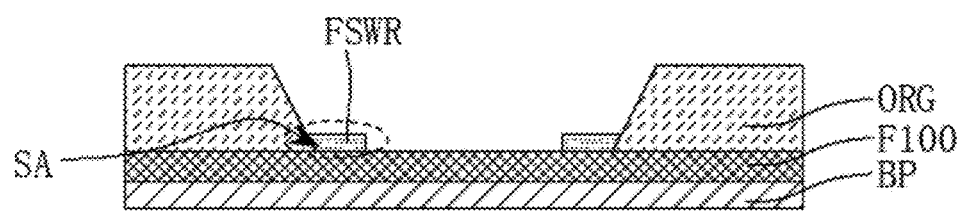
FIG. 12 shows a structural view of insufficient etching of a conductive material layer in a barrier groove in the related art.

Step S011, as shown in FIG. 8, a base substrate BP, a driving circuit layer F100 and an organic thin film layer ORG are sequentially prepared, and the organic thin film layer ORG is defined with a barrier groove BG. Step S012, as shown in FIG. 9, a conductive material layer FSWA is formed on a surface of the organic thin film layer ORG away from the base substrate BP. Then, as shown in FIG. 10 to FIG. 12, a photolithography process is adopted to pattern the conductive material layer FSWA. Specifically, in step S013, as shown in FIG. 10, photoresist PR fills in a side of the conductive material layer FSWA away from the base substrate BP. The photoresist PR fills the barrier groove BG. Due to the fluidity of photoresist, a thickness of photoresist PR in the edge region SA of the barrier groove BG is the greatest. In step S014, as shown in FIG. 11, the photoresist PR is exposed and developed. In the edge region SA of the barrier groove BG, the photoresist PR cannot be fully exposed and be left, and a residual photoresist PRR may shield and protect the conductive material layer FSWA below (on a side close to the base substrate BP). In step S015, as shown in FIG. 12, when the conductive material layer FSWA is patterned by etching, the conductive material covered by the residual photoresist PRR cannot be fully etched and be left, and a residual conductive material FSWR may cause a short circuit between two adjacent signal wires SW. In the present disclosure, the residual photoresist PRR refers to a part of photoresist that is expected to be exposed, developed and removed but is left due to insufficient exposure and development. A part (i.e., a part that serves as a mask for subsequent etching) that is intentionally kept without being developed by a process is a photoresist kept in a normal process rather than the residual photoresist PRR.

The inventor tried to eliminate a residue of the photoresist through an overexposure solution, to reduce the short-circuit defects. However, it is found that this solution would greatly extend an exposure time and further affect the exposure tact, which greatly affects the productivity and increases the cost of array substrate ARR. In addition, the inventor also found that as the width and spacing of the signal wire SW became less and less, the overexposure solution is increasingly restricted by the process capability of the exposure machine.

To solve such the short-circuit defect, as shown in FIG. 13, in a first solution provided by the embodiment of the present disclosure, the preparation method shown in steps S110 to S120 below may be adopted to prepare the array substrate ARR according to the embodiment of the present disclosure.

Step S110, as shown in FIG. 14, a driving circuit layer F100 is formed on a side of the base substrate BP, and the driving circuit layer F100 is provided with a first pillow body DA on a peripheral region BB of the array substrate ARR; the first pillow body DA includes a first pillow metal block DAC located on at least one of a source drain metal layer SD and a gate layer GT, and a first pillow insulating layer DAI covers the first pillow metal block DAC;

Step S120, as shown in FIG. 15 to FIG. 29, an organic thin film layer ORG and a conductive layer FSW are sequentially formed on a side of the driving circuit layer F100 away from the base substrate BP. The organic thin film layer ORG is defined with a barrier groove BG on the peripheral region BB, and a part of the first pillow body DA is covered by the organic thin film layer ORG and the other part of the first pillow body DA is exposed by the barrier groove BG, such that the exposed part of the first pillow body DA forms a pillow step DAS protruding from a bottom of the barrier groove BG. The conductive layer FSW is provided with a signal wire SW that passes across an edge of the barrier groove BG, and an edge of the signal wire SW at least partially overlaps with the first pillow body DA. In other words, the edge of the signal wire SW is at least partially carried on the pillow step DAS.

In an example, preparation of the organic thin film layer ORG and the conductive layer FSW is a part of preparation of the electrode composite layer F200. In other words, in step S120, an electrode composite layer F200 is prepared on a side of the driving circuit layer F100 away from the base substrate BP. The electrode composite layer F200 includes an organic thin film layer ORG and a conductive layer FSW located on a side of the organic thin film layer ORG away from the base substrate BP.

In an example, step S120 may include steps S121 to S126.

Step S121, as shown in FIG. 15, an organic thin film layer ORG is formed on a side of the driving circuit layer F100 away from the base substrate BP, and the organic thin film layer ORG is defined with a barrier groove BG on the peripheral region BB. A part of the first pillow body DA is covered by the organic thin film layer ORG, and the other part of the first pillow body DA is exposed in the barrier groove BG. In other words, the first pillow body DA is located at a lower edge of the barrier groove BG (close to the edge of the base substrate). A part of the first pillow body DA exposed to the barrier groove BG forms a pillow step DAS.

Figure 16:
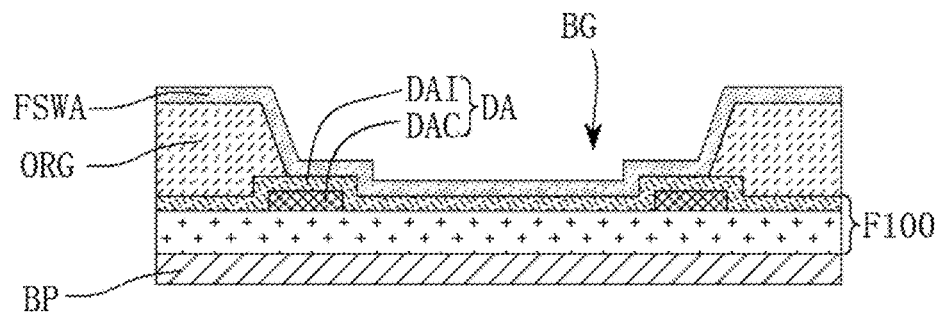
FIG. 16 shows a structural view of a conductive material layer formed on an organic thin film layer in an embodiment of the present disclosure.

Step S122, as shown in FIG. 16, a conductive material layer FSWA is formed on a side of the organic thin film layer ORG away from the base substrate BP, and the conductive material layer FSWA covers the organic thin film layer ORG and the barrier groove BG. The conductive material layer FSWA covers the pillow step DAS in the barrier groove BG.

Figure 17:
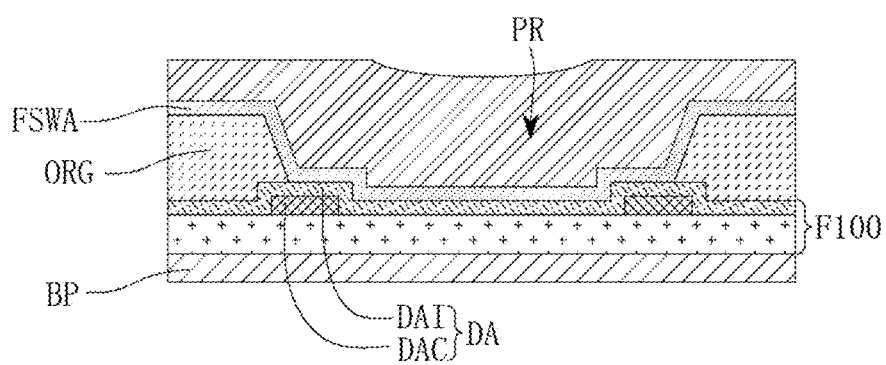
FIG. 17 shows a structural view of coating photoresist on a side of a conductive material layer away from a base substrate in an embodiment of the present disclosure.

Step S123, as shown in FIG. 17, photoresist PR is coated on a side of the conductive material layer FSWA away from the base substrate BP, and the photoresist PR fills the barrier groove BG. As shown in FIG. 17, due to a raising effect of the first pillow body DA, a thickness of the photoresist PR above the pillow step DAS decreases.

In step S124, the photoresist PR is exposed and developed. At an edge region of the barrier groove BG, a thickness of the photoresist PR at a part raised by the pillow step DAS decreases. Thus, the photoresist PR is fully exposed, and the residue less likely appears.

In step S125, the conductive material layer FSWA is etched to form a required structure, such as a required signal wire SW. In this process, since there is no shield of the residual photoresist, at the edge region of the barrier groove BG, the conductive material may be fully etched at the part raised by the pillow step DAS, thereby ensuring the accuracy of the pattern of the signal wire SW, and avoiding the short circuit between the signal wires SW caused by the residual conductive material between the signal wires SW.

Step S126, the photoresist PR is removed.

In a first solution provided by the embodiment of the present disclosure, the first pillow body DA may be prepared on the driving circuit layer F100 without adding any process by adjusting a mask of the source drain metal layer SD or the gate layer GT. The first pillow insulating layer DAI is an inorganic material layer located on a side of the first pillow metal block DAC away from the base substrate BP, which may be different according to the difference of the first pillow metal block DAC. For example, in an example, the first pillow metal block DAC is located on the source drain metal layer SD and the first pillow insulating layer DAI is located in the passivation layer. For another example, in another example, the first pillow metal block DAC is located on the gate layer GT, and the first pillow insulating layer DAI is located on at least one of the interlayer dielectric layer ILD and the passivation layer. For another example, in another example, the first pillow metal block DAC includes a bottom metal block located on the gate layer GT and a top metal block located on the source drain metal layer SD, the top metal block is carried on the bottom metal block, and for example, edges of the two are flush. In this way, the first pillow metal block DAC may have a greater thickness, such that a segment difference between the pillow step DAS and a bottom of the barrier groove BG is much greater.

When the organic material layer is patterned to form the organic thin film layer ORG and the barrier groove BG, the organic thin film layer ORG is made to cover a part of the first pillow body DA and the barrier groove BG is made to expose a part of the first pillow body DA. Thus, as shown in FIG. 15, the first pillow body DA forms the pillow step DAS which is connected to a sidewall of the barrier groove BG and protrudes from the bottom of the barrier groove BG. As shown in FIG. 16, when the conductive material layer FSWA is formed, the conductive material layer FSWA covers the pillow step DAS, such that a segment difference between the conductive material layer FSWA on the pillow step DAS and a surface of the organic thin film layer ORG is less. As shown in FIG. 17, compared to the related art, after the photoresist PR is coated, a thickness of the photoresist on the pillow step DAS is reduced, and the residue of the photoresist less likely appear during the exposure and the development. In this way, a residue of the conductive material cannot appear on a part of a gap between two adjacent signal wires SW on the pillow step DAS, so as to eliminate the short-circuit defects between the signal wires SW. In this way, as shown in FIG. 18, FIG. 21, FIG. 24 and FIG. 27, in a formed array substrate ARR, the gap between the signal wires SW overlaps with the first pillow body DA.

In an embodiment, when the conductive material layer FSWA is patterned by the photolithography process, a focus plane of an exposure machine is an upper surface of the photoresist (a surface away from the base substrate BP), or at a position close to the upper surface of the photoresist (for example, a height away from the upper surface is less than 10% of a maximum thickness of the photoresist)

In an embodiment, a height of the pillow step DAS is greater than or equal to 10% of a depth of the barrier groove BG. For example, the height of the pillow step DAS is within 10% to 40% of the depth of the barrier groove BG. For example, the height of the pillow step DAS is 0.3 to 0.5 μm, and the depth of the barrier groove BG is 1.5 to 3 μm. In the embodiment of the present disclosure, the depth of the barrier groove BG refers to a segment difference between a bottom surface of the barrier groove BG (close to a bottom surface of the base substrate BP) and a top opening of the barrier groove BG (away from an opening of the base substrate BP). In the embodiment of the present disclosure, the height of the pillow step DAS refers to a segment difference between a top surface of the pillow step DAS (a surface away from the base substrate BP) and a bottom surface of the barrier groove BG. In the embodiment of the present disclosure, the segment difference refers to a distance difference of distances between two structures or surfaces and the base substrate BP. In an example, the height of the pillow step DAS is basically equal to the thickness of the first pillow metal block DAC.

In an embodiment, as shown in FIG. 19, FIG. 22, FIG. 24 and FIG. 27, a size of a part, where an orthographic projection of the first pillow body DA on the base substrate BP overlaps with an orthographic projection of the organic thin film layer ORG on the base substrate BP, is greater than or equal to 2 microns, especially greater than or equal to 3 microns, such as within 3 to 5 microns, in a direction perpendicular to a lower edge of the barrier groove BG. In this way, it may be ensured that at least a part of the first pillow body DA is covered by the organic thin film layer ORG, such that a top surface of the first pillow body DA is connected to a side surface of the barrier groove BG, thereby overcoming the influence on factors such as the process fluctuation, alignment error and the like.

Figure 18:
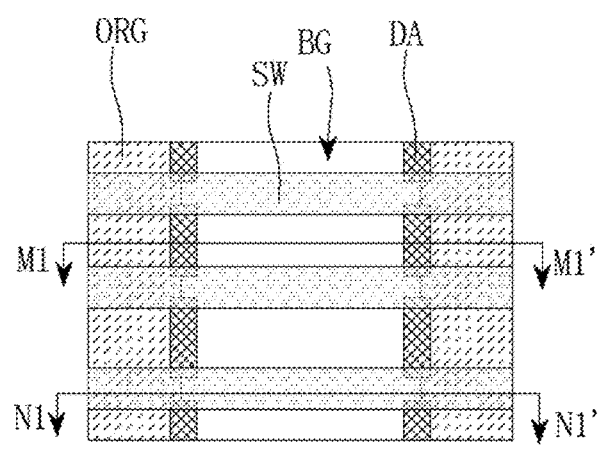
FIG. 18 shows a structural view of a relative position relationship of a signal wire, an organic thin film layer and a first pillow body in an embodiment of the present disclosure.
Figure 19:
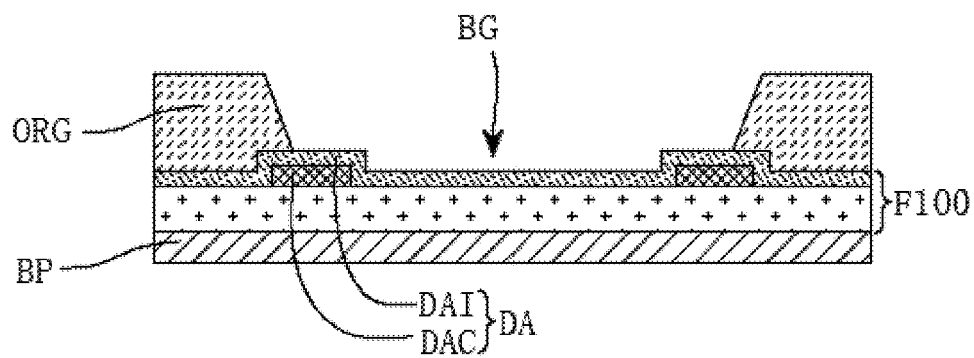
FIG. 19 shows a sectional structural view at M1-M1' in FIG. 18.
Figure 20:
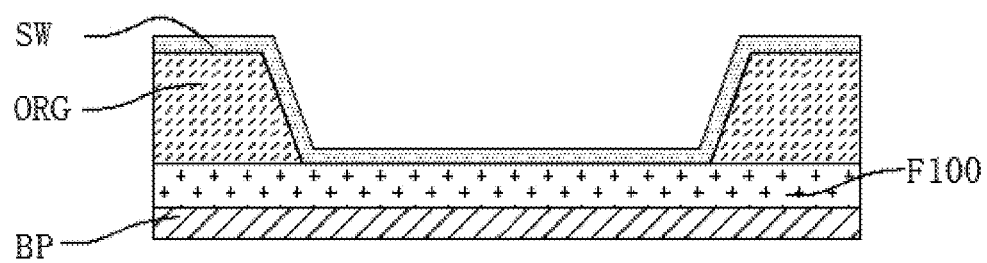
FIG. 20 shows a sectional structural view at N1-N1' in FIG. 18.

In an embodiment, as shown in FIGS. 18 to 20, in at least a partial region of the barrier groove BG, two edges of the barrier groove BG are provided with a plurality of the first pillow bodies DA, respectively. Two edges of a same signal wire SW overlaps with two adjacent first pillow bodies DA, respectively, and the signal wire SW covers a gap between two adjacent first pillow bodies DA. In this way, in at least a partial region, at the same edge of the barrier groove BG, two edges of at least one signal wire SW overlap with two adjacent first pillow bodies DA, respectively. In other words, there is a gap between at least two first pillow bodies DA, and at least one signal wire SW covers the gap. In this way, when curing the frame sealant, external light may irradiate the frame sealant through the gap, which is conducive to improving a curing speed of the frame sealant, increasing the production tact and reducing the production cost.

In an example, as shown in FIG. 18 to FIG. 20, a plurality of the first pillow bodies DA are provided at two lower edges of the barrier groove BG, respectively. At any one of the lower edges of the barrier groove BG, a gap is defined between the adjacent first pillow bodies DA, two edges of the signal wire SW overlap with the two adjacent first pillow bodies DA, respectively, and the signal wire SW covers the gap between the two adjacent first pillow bodies DA.

Further, as shown in FIGS. 18 to 20, the first pillow bodies DA, overlapped with the same signal wire and respectively located on two opposite lower edges of the barrier groove BG, are not connected, and that is, a gap is defined between the first pillow bodies DA. In other words, the first pillow body DA is only arranged close to the lower edge of the barrier groove BG, and the two lower edges of the barrier groove BG are respectively arranged with the first pillow bodies DA independent from each other. In this way, a gap without the first pillow body DA is defined between the two lower edges of the barrier groove BG, which is conducive to improving an intensity of the light irradiating to the frame sealant and improving the curing speed of the frame sealant.

Figure 21:
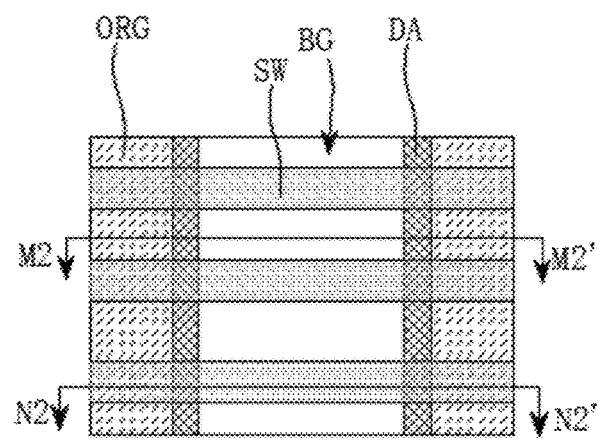
FIG. 21 shows a structural view of a relative position relationship of a signal wire, an organic thin film layer and a first pillow body in an embodiment of the present disclosure.
Figure 22:
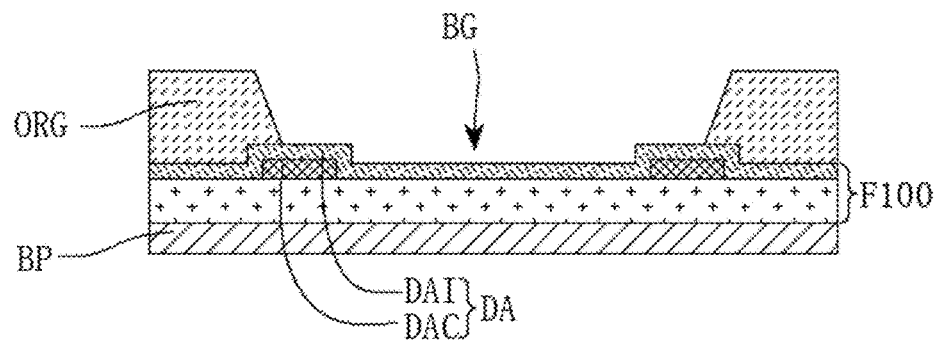
FIG. 22 shows a sectional structure of M2-M2' in FIG. 21.
Figure 23:
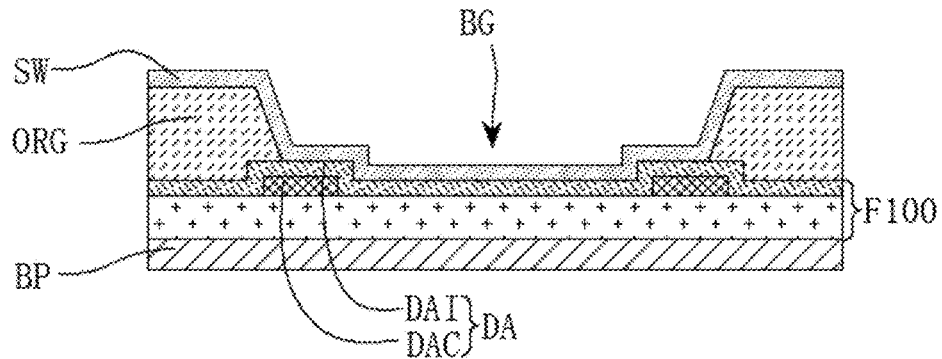
FIG. 23 shows a sectional structural view at N2-N2' in FIG. 21.

In another embodiment, as shown in FIGS. 21 to 23, in at least a partial region of the barrier groove BG, two edges of the barrier groove BG are provided with one first pillow body DA, respectively, and the signal wire SW intersects with the first pillow body DA.

In other words, in at least a partial region, at least a part of the adjacent first pillow bodies DA with the relatively small sizes may be connected in sequence to form as a strip-shaped first pillow body DA, and the adjacent first pillow bodies DA are located on the lower same edge of the barrier groove BG. In this way, at least one signal wire SW intersects with the strip-shaped first pillow body DA, and two sides of the signal wire SW overlap with a same strip-shaped first pillow body DA. In this arrangement mode, it is possible to directly set the strip-shaped first pillow body DA without setting the first pillow body DA with smaller size, which on the one hand may simplify the design of the display panel PNL and reduce the size requirement to the mask, and on the other hand overcome the restriction on the size of the first pillow body DA caused by the process factors such as exposure accuracy, alignment error and the like, thereby improving the application scope on display panels PNL with different sizes. Moreover, the arrangement of the strip-shaped first pillow body DA may ensure that the edge of the signal wire SW overlaps with the first pillow body DA, thereby avoiding that the edge of the signal wire SW is located in the gap of the first pillow body DA caused by the factors such as the process fluctuation, alignment error and the like, and improving the process window and overcoming possible defects.

In an example, as shown in FIGS. 21 to 23, in the signal wires SW that are adjacent in sequence and are in a same group, each first pillow body DA that overlaps with the signal wire SW in this group and is located on the same lower edge of the barrier groove BG is connected to each other to form a strip-shaped first pillow body DA. In other words, each of the signal wires SW adjacent in sequence intersects with the same strip-shaped first pillow body DA.

Further, as shown in FIG. 21, a gap is defined between two strip-shaped first pillow bodies DA that are opposite to each other, such that the gap between the first pillow bodies DA enables light to transmit, which is conducive to improving the curing speed of the frame sealant.

Figure 24:
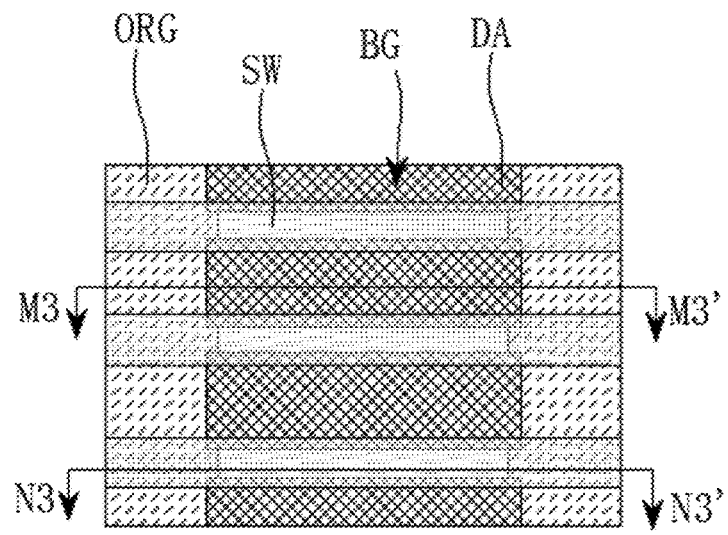
FIG. 24 shows a structural view of a relative position relationship of a signal wire, an organic thin film layer and a first pillow body in an embodiment of the present disclosure.
Figure 25:
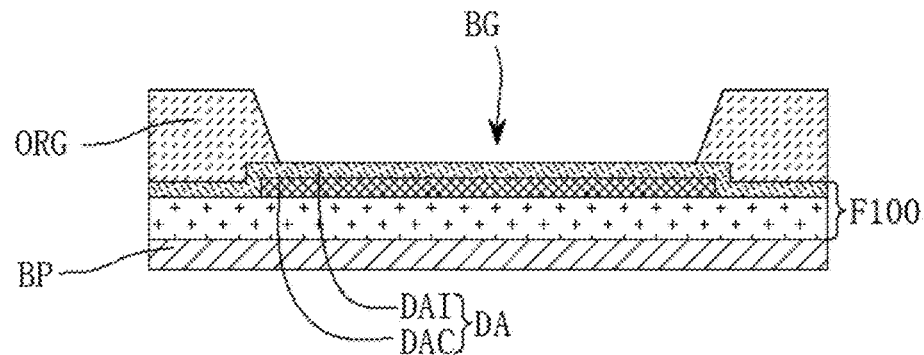
FIG. 25 shows a sectional structural view at M3-M3' in FIG. 24.
Figure 26:
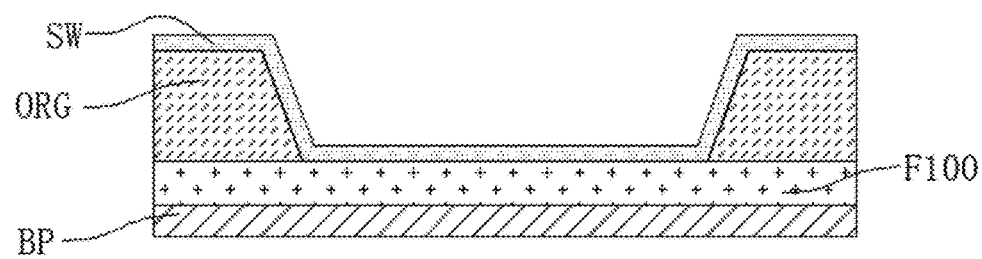
FIG. 26 shows a sectional structural view at N3-N3' in FIG. 24.

In another embodiment, as shown in FIGS. 24 to 26, in at least a partial region of the barrier groove BG, a plurality of the first pillow bodies DA are provided. Two ends of any one of the first pillow bodies DA are covered by the organic thin film layers ORG at two sides of the barrier groove BG, respectively; each of two edges of the signal wire SW at least partially overlaps with two adjacent first pillow bodies DA, and the signal wire SW covers a gap between the two adjacent first pillow bodies DA. In other words, the first pillow body DA may extend along an extension direction of the signal wire SW that overlaps with the first pillow body DA and run through the barrier groove BG, and two ends of the first pillow body DA overlap with the two sidewalls of the barrier groove BG (i.e. sidewalls of the organic thin film layer ORG). Thus, residue of the electrode material at the lower edge of the barrier groove BG may be avoided, and residue of the electrode material at bottom of the barrier groove BG may also be avoided, thereby further reducing the risk of short circuit of the signal wire SW.

In an example, at the bottom of the barrier groove BG, an edge of any one of the signal wires SW is located on the first pillow body DA (a side of the first pillow body DA away from the base substrate BP), and the two edges of the signal wire SW are respectively located on two different first pillow bodies DA. A gap is defined between two adjacent first pillow bodies DA, the signal wire SW covers the gap, and the two edges overlap with the two first pillow bodies DA, respectively. Especially in the barrier groove BG where a width of the barrier groove BG (a size perpendicular to the extension direction of the barrier groove BG) is relatively small, such as the width of the barrier groove BG ranges from 10 to 30 microns, the arrangement of the first pillow body DA may simplify the design of the first pillow body DA and reduce the requirements for the process.

Figure 27:
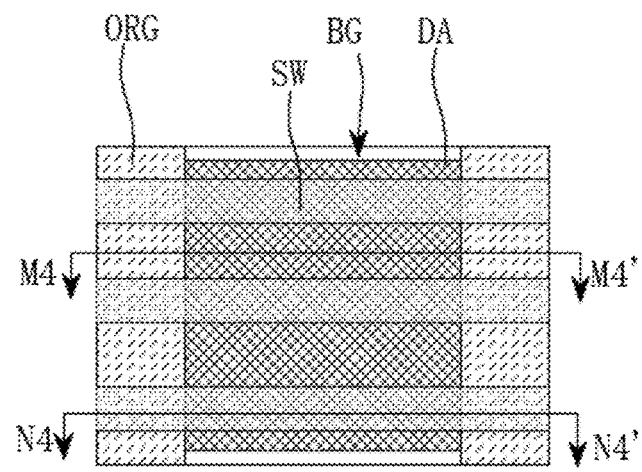
FIG. 27 shows a structural view of a relative position relationship of a signal wire, an organic thin film layer and a first pillow body in an embodiment of the present disclosure.

In another embodiment, as shown in FIGS. 27 to 29, in at least a partial region of the barrier groove BG, there is one the first pillow body DA and two sides of the first pillow body are respectively covered by the organic thin film layers ORG at two sides of the barrier groove BG, and a part of the signal wire on a bottom surface of the barrier groove BG is at least partially carried on the first pillow body DA.

In other words, at least one first pillow body DA overlaps with a plurality of adjacent signal wires SW, and the part of these the signal wires SW at the bottom of the barrier groove BG is completely located on the first pillow body DA. In other words, in at least a partial region of the barrier groove BG, an orthographic projection of the part of the plurality of the signal wires SW at the bottom of the barrier groove BG on the base substrate BP is located within an orthographic projection of a same first pillow body DA on the base substrate BP.

In an embodiment of the present disclosure, the driving circuit layer F100 is provided with a ground wire on the peripheral region BB, and the ground wire at least partially overlaps with the barrier groove BG. At least a part of the first high metal block DAC is a part of the ground wire. In this way, the short-circuit defects in the barrier groove BG may be reduced by the partial adjustment to the pattern of the ground wire, so as to improve the yield without increasing the preparation cost of ARR.

In another embodiment of the present disclosure, the driving circuit layer F100 is provided with a ground wire on the peripheral region BB, and the ground wire at least partially overlaps with the barrier groove BG. A position of the signal wire SW passing across the edge of the barrier groove BG does not overlap with the ground wire.

As shown in FIG. 30, in a second solution provided by the present disclosure, an array substrate ARR of the present disclosure may be prepared using a preparation method shown in steps S210 to S220 below.

Figure 31:
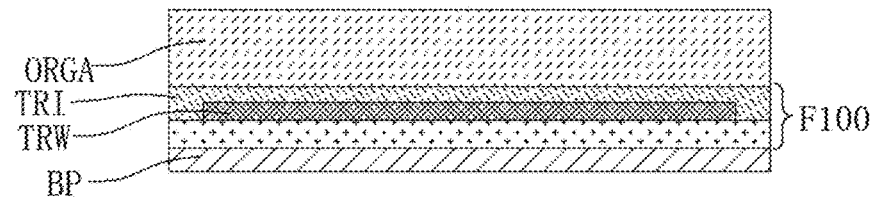
FIG. 31 shows a structural view of an organic material layer formed on a side of a driving circuit layer away from a base substrate in an embodiment of the present disclosure.

Step S210, as shown in FIG. 31, a driving circuit layer F100 is formed on a side of the base substrate BP. The driving circuit layer F100 is provided with a switch wire TRW on a peripheral region BB of the array substrate ARR. The switch wire TRW is located on at least one of the source drain metal layer SD and the gate layer GT.

Step S220, as shown in FIGS. 31 to 36, the organic thin film layer ORG and the conductive layer FSW are sequentially formed on a side of the driving circuit layer F100 away from the base substrate BP. The organic thin film layer ORG is defined with a barrier groove BG and a via hole HH exposing the switch wire TRW on the peripheral region BB. At least a part of the switch wire TRW passes across the barrier groove BG (i.e., two ends of the switch wire TRW are respectively located on two sides of the barrier groove BG). The conductive layer FSW is provided with signal wires SW separated by an edge of the barrier groove BG, and the adjacent two ends of the signal wires SW are electrically connected through the switch wire TRW. The signal wire SW and the switch wire TRW are connected through the via hole HH. In this way, the signal wire SW passes across the barrier groove BG through the switch wire TRW located in the driving circuit layer F100. Even if there is conductive material left in the barrier groove BG, the residual conductive material cannot be electrically connected to the signal wire SW, which may avoid the short circuit between the signal wires SW caused by the conductive material left in the barrier groove BG.

In an example, the preparation of the organic thin film layer ORG and the conductive layer FSW is a part of the preparation of the electrode composite layer F200. In other words, in step S220, the electrode composite layer F200 is prepared on a side of the driving circuit layer F100 away from the base substrate BP. The electrode composite layer F200 includes an organic thin film layer ORG and a conductive layer FSW located on a side of the organic thin film layer ORG away from the base substrate BP.

In an example, the conductive layer FSW also includes a conductive material in the barrier groove BG, the conductive material is located at an edge of the barrier groove BG, and disconnected from the signal wires SW.

Figure 32:
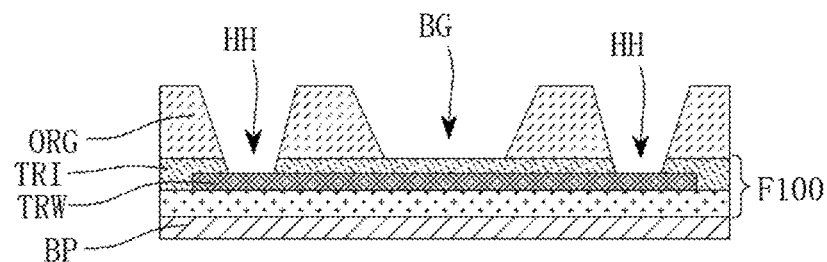
FIG. 32 shows a structural view of patterning an organic material layer and a switch insulating layer to form a via hole and a barrier groove in an embodiment of the present disclosure.

In an example, as shown in FIG. 31, the driving circuit layer F100 also includes a switch insulating layer TRI covering the switch wire TRW on the peripheral region BB. As shown in FIG. 32, when a via hole HH that enables the signal wire SW with the switch wire TRW to be electrically connected is formed, the via hole HH runs through the organic thin film layer ORG and the switch insulating layer TRI, such that two ends of the switch wire TRW are exposed through two via holes HH located on two sides of the barrier groove BG. The switch insulating layer TRI may be adjusted according to the switch wire TRW. For example, when the switch wire TRW is located on the source drain metal layer SD, the switch insulating layer TRI may be located on the passivation layer. For another example, when the switch wire TRW is located on the gate layer GT, the switch insulating layer TRI may be located on at least one of the interlayer dielectric layer ILD and the passivation layer.

Figure 36:
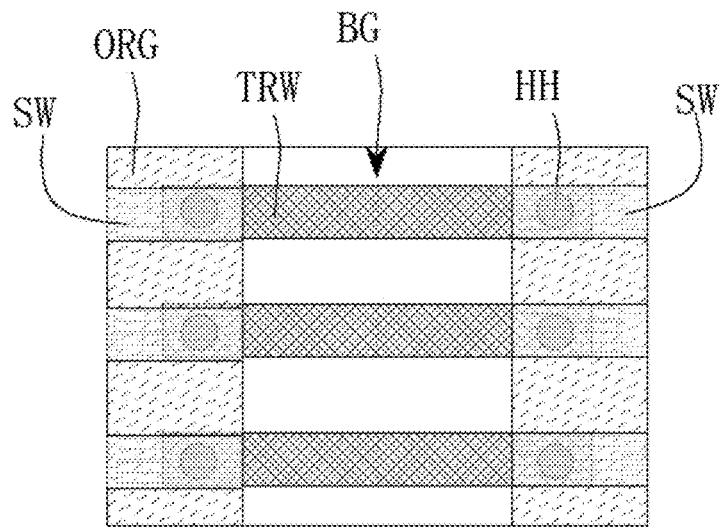
FIG. 36 shows a structural view of a relative position of a signal wire, a switch wire, an organic thin film layer, a barrier groove and a via hole in an embodiment of the present disclosure.

In an example, as shown in FIG. 36, at least a part of the switch wire TRW passes across the barrier groove BG, and each of two ends of the switch wire is exposed by the via hole HH. At least a part of the signal wire SW is separated by the barrier groove BG, and the adjacent two ends of the signal wires SW are connected to the two ends of the switch wire TRW through the via hole HH, respectively.

In an example, as shown in FIG. 36, in at least a partial region of the array substrate ARR, a number of switch wires TRW passing across the barrier groove BG is the same as a number of signal wires SW that needs to pass cross the barrier groove BG, and the switch wires TRW and the signal wires SW are arranged in one-to-one correspondence. The adjacent ends of the signal wire SW that is separated by the barrier groove BG are electrically connected to the two ends of the corresponding switch wire TRW through a via hole HH. In a further example, each signal wire SW passes across the barrier groove BG through the switch wire TRW.

Figure 35:
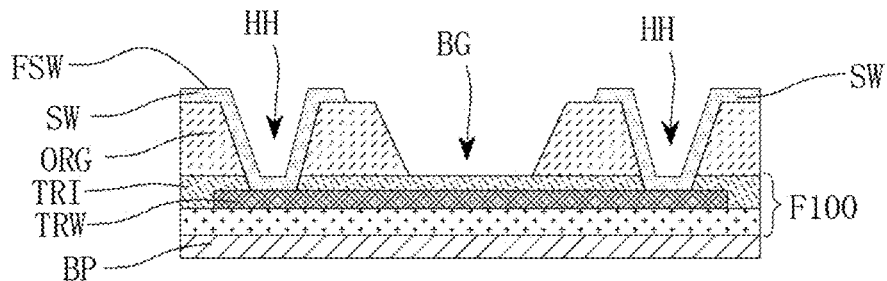
FIG. 35 shows a structural view of patterning a conductive material layer in an embodiment of the present disclosure.

In an example, as shown in FIG. 35, an end of the signal wire SW is outside the barrier groove BG, and that is, an orthographic projection of the signal wire SW on the base substrate BP does not overlap with an orthographic projection of the barrier groove BG on the base substrate BP.

In an example, at least one switch wire TRW passes across a plurality of adjacent barrier grooves BG. In this way, the signal wire SW may continuously pass through the plurality of barrier grooves BG by the same switch wire TRW without providing a plurality of different switch wires TRW to pass across a plurality of different barrier grooves BG, which avoid that the via hole HH is defined in the organic thin film layer ORG between different barrier grooves BG.

In an example, at least one switch wire TRW includes different wire segments, and adjacent wire segments are arranged on the source drain metal layer SD and the gate layer GT, respectively. In other words, the switch wire TRW may be switched between the source drain metal layer SD and the gate layer GT to avoid other structures of the source drain metal layer SD or the gate layer GT.

In an example, at least one signal wire SW is partially located in the barrier groove BG and extends in a direction parallel to an extension direction of the barrier groove BG. A wire part of the signal wire SW on the organic thin film layer ORG and a wire part of the signal wire SW in the barrier groove BG may also be switched through the switch wire TRW. An end of the switch wire TRW configured to switch the signal wire SW is located in the organic thin film layer ORG and connected to the wire part of the signal wire SW on the organic thin film layer ORG through a via hole HH. The other end of the switch wire TRW is located in the barrier groove BG and is connected to the wire part of the signal wire SW located in the barrier groove BG through a via hole. In this way, the switch wire TRW does not need to pass across the barrier groove BG.

In an example, step S220 may include steps shown in steps S221 to S225 below.

Step S221, as shown in FIG. 31, and an organic material layer ORGA is prepared on a side of a driving circuit layer F100 away from a base substrate BP.

Figure 33:
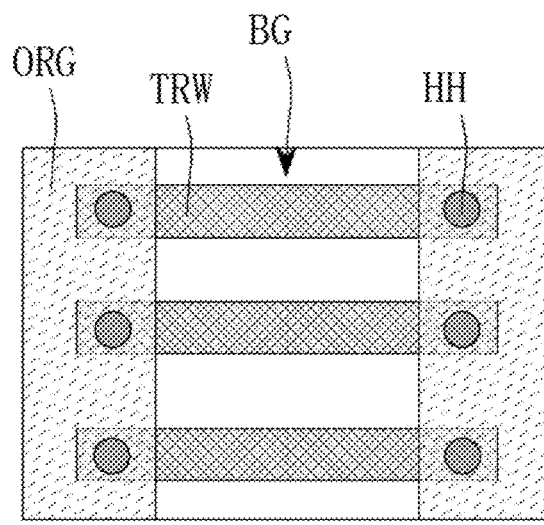
FIG. 33 shows a structural view of a relative position relationship of a switch wire, an organic thin film layer, a barrier groove and a via hole in an embodiment of the present disclosure.

Step S222, as shown in FIG. 32, the organic material layer ORGA and a switch insulating layer TRI are patterned. An organic thin film layer ORG is defined with a barrier groove BG, and the organic thin film layer ORG and the switch insulating layer TRI are defined with a via hole HH exposing the switch wire TRW. As shown in FIG. 32 and FIG. 33, at least a part of the switch wire TRW passes across the barrier groove BG, and two ends of the switch wire are exposed by the via holes HH, respectively.

Figure 34:
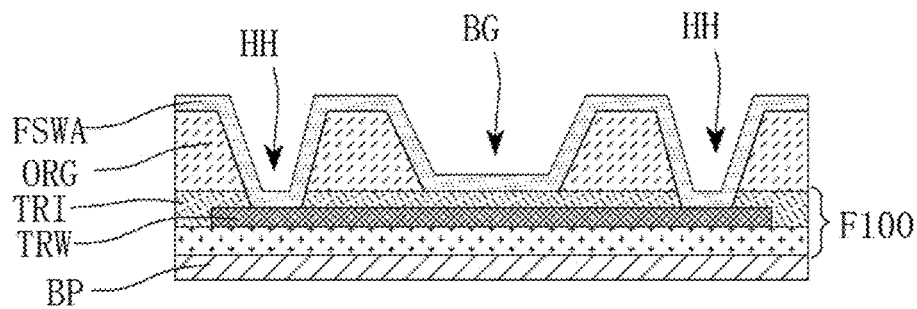
FIG. 34 shows a structural view of a conductive material layer formed on an organic thin film layer in an embodiment of the present disclosure.

Step S223, as shown in FIG. 34, a conductive material layer FSWA is formed on a side of the organic thin film layer ORG away from the base substrate BP. The conductive material layer FSWA may cover the organic thin film layer ORG and the barrier groove BG.

Step S224, as shown in FIG. 35 and FIG. 36, the conductive material layer FSWA is patterned to prepare the signal wire SW. At least a part of the signal wire SW passes across the barrier groove BG through the switch wire TRW.

Figures 1, 37:
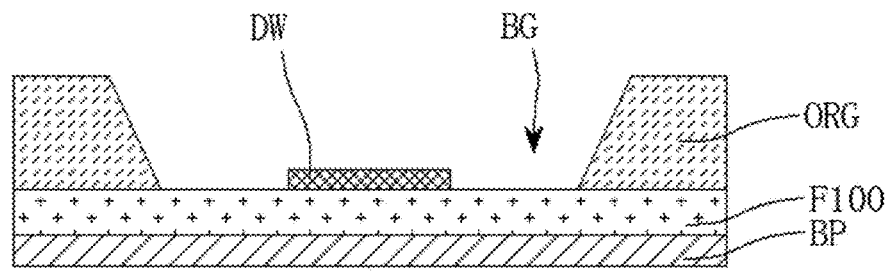
Figures 2, 37:
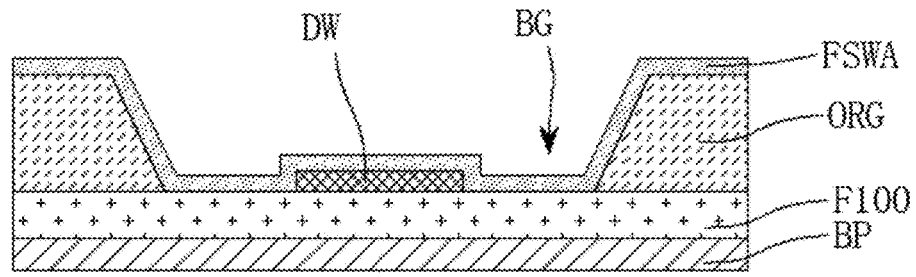

As shown in FIG. 37-1, in the array substrate ARR according to the embodiment of the present disclosure, at least a partial region of the barrier groove BG is provided with a conductive structure DW located on the source drain metal layer SD. In the related art, short circuit defects often occur between the source drain metal layers SD located in the barrier groove BG. After analyzing such defects, it is found the conductive material is left between the conductive structures DW, and the conductive structures DW are short circuited through the residual conductive material. The preparation process of the array substrate ARR in the related art is traced. As shown in FIG. 37-1 to FIG. 40, the array substrate ARR in the related art is prepared by a method shown in steps S021 to S025 below.

Figure 38:
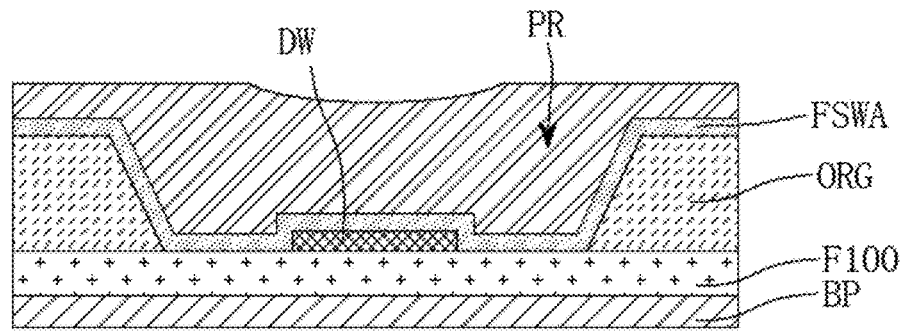
FIG. 38 shows a structural view of coating photoresist in the related art.
Figure 39:
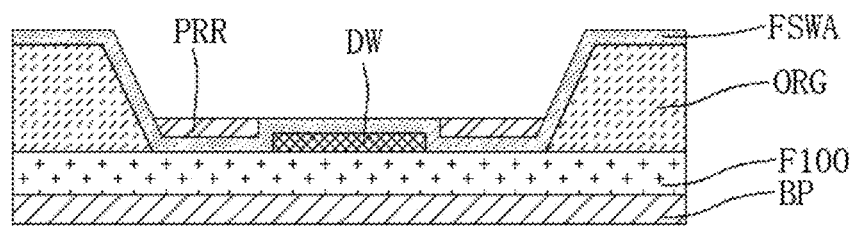
FIG. 39 shows a structural view of insufficient photoresist exposure in a barrier groove in the related art.

Step S021, as shown in FIG. 37-1, a base substrate BP, a driving circuit layer F100 and an organic thin film layer ORG are prepared in sequence. A barrier groove BG is defined on a peripheral region BB of the organic thin film layer ORG, the driving circuit layer F100 is provided with a conductive structure DW on a peripheral region BB, and at least a part of the conductive structure DW is exposed to the barrier groove BG, for example, it is completely located in the barrier groove BG. Step S022, as shown in FIG. 37-2, a conductive material layer FSWA is formed on a surface of the organic thin film layer ORG away from the base substrate BP. Then, as shown in FIG. 38 to FIG. 40, a photolithography process is adopted to pattern the conductive material layer FSWA. Specifically, in step S023, as shown in FIG. 39, photoresist PR is coated on a side of the conductive material layer FSWA away from the base substrate BP. The photoresist PR fills the barrier groove BG. Due to the fluidity of photoresist, a thickness of photoresist PR between the conductive structure DW and the edge of the barrier groove BG is the greatest. In step S024, as shown in FIG. 39, the photoresist PR is exposed and developed. Between the conductive structure DW and the edge of the barrier groove BG, the photoresist PR cannot be fully exposed and be left, and a residual photoresist PRR may shield and protect the conductive material layer FSWA below (on a side close to the base substrate BP). In step S025, as shown in FIG. 40, when the conductive material layer FSWA is patterned by etching, the conductive material covered by the residual photoresist PRR cannot be fully etched and be left, and a residual conductive material FSWR may cause a short circuit between two adjacent conductive structures DW.

Similarly, the inventor tried to eliminate a residue of the photoresist through an overexposure solution, to reduce the short-circuit defects. However, it is found that this solution would greatly extend an exposure time and further affect the exposure tact, which greatly affects the productivity and increases the cost of array substrate ARR. In addition, the inventor also found that as a size of the each structure in the array substrate ARR continues to reduce, the overexposure solution is increasingly restricted by the process capability of the exposure machine.

To solve such the short-circuit defect, as shown in FIG. 41, in a third solution provided by the embodiment of the present disclosure, the preparation method shown in steps S310 to S320 below may be adopted to prepare the array substrate ARR according to the embodiment of the present disclosure.

Step S310, as shown in FIG. 42, a driving circuit layer F100 is formed on a side of the base substrate BP. The driving circuit layer F100 is provided with a second pillow body DB and a conductive structure DW on a peripheral region BB of an array substrate ARR. The second pillow body DB includes a second pillow metal block DBC located on the gate layer GT and a second pillow insulating layer DBI covering the second pillow metal block DBC, such that the second pillow body DB forms a boss structure protruding upward. The conductive structure DW is located on a side of the second pillow body DB away from the base substrate BP, and at least partially overlaps with the second pillow body DB;

Step S320, as shown in FIGS. 42 to 46, an organic thin film layer ORG and a conductive layer FSW are sequentially formed on a side of the driving circuit layer F100 away from the base substrate BP. The organic thin film layer ORG is defined with a barrier groove BG on the peripheral region BB, and at least a part of the second pillow body DB and at least a part of the conductive structure DW are exposed by the barrier groove BG. The part of the conductive structure DW exposed by the barrier groove BG is completely carried on the second pillow body DB. In other words, the part of the conductive structure DW exposed by the barrier groove BG is completely located on the boss structure formed by the second pillow body DB.

When the conductive layer FSW is formed, since there is step formed by the second pillow body DB between the conductive structure DW and a bottom of the barrier groove BG, the conductive material on the step may be fully etched.

Thus, even if the conductive material is left on edges of the second pillow body DB and the barrier groove BG, the conductive materials cannot be connected to the conductive structure DW, which avoids the short circuit between the conductive structures DW. In addition, even if the conductive material adjacent to the conductive structure DW on the step is accidentally not fully etched, a residual conductive material is not continuous at the edge of the second pillow body DB due to the segment difference, which further reduces the risk of short circuit of the conductive structures DW due to the residual conductive material.

In an example, there is a gap between an edge of the part of the conductive structure DW exposed by the barrier groove BG and an edge of the second pillow body DB. For example, as shown in FIG. 42, the conductive structure DW and the second pillow body DB are completely located in the barrier groove BG, and a size of the conductive structure DW is smaller than that of the second pillow body DB.

In an example, the conductive layer FSW includes a conductive material in the barrier groove BG, the conductive material FSW is located between an edge of the second pillow body DB and an edge of the barrier groove BG, and the conductive material is disconnected from the conductive structure DW.

In an example, the preparation of the organic thin film layer ORG and the conductive layer FSW is a part of the preparation of the electrode composite layer F200. In other words, in step S320, the electrode composite layer F200 is prepared on a side of the driving circuit layer F100 away from the base substrate BP. The electrode composite layer F200 includes an organic thin film layer ORG and a conductive layer FSW located on a side of the organic thin film layer ORG away from the base substrate BP.

In an example, step S320 may include steps S331 to S335.

Step S331, as shown in FIG. 42, an organic thin film layer ORG is formed on a side of the driving circuit layer F100 away from the base substrate BP. The organic thin film layer ORG is defined with a barrier groove BG on a peripheral region BB, and at least a part of the second pillow body DB and at least a part of the conductive structure DW are exposed by the barrier groove BG. The part of the conductive structure DW exposed by the barrier groove BG is completely carried on the second pillow body DB.

Figure 43:
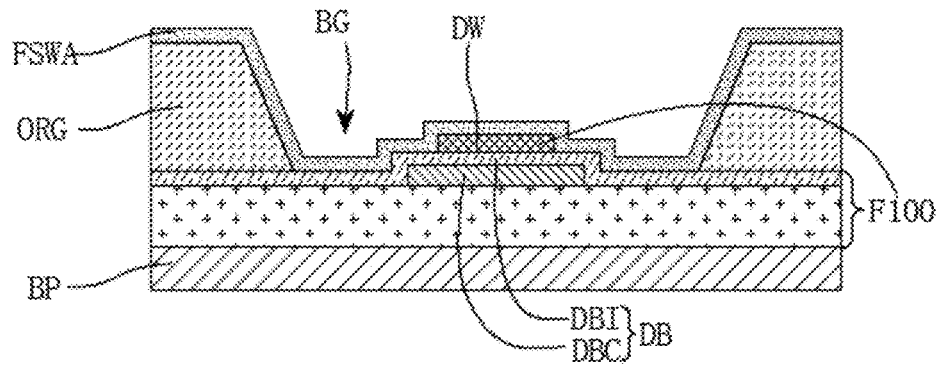
FIG. 43 shows a structural view of a conductive material layer formed on an organic thin film layer in an embodiment of the present disclosure.

Step S332, as shown in FIG. 43, a conductive material layer FSWA is formed on a side of the organic thin film layer ORG away from the base substrate BP, and the conductive material layer FSWA covers the organic thin film layer ORG and the barrier groove BG. The conductive material layer FSWA covers the second pillow body DB and the conductive structure DW in the barrier groove BG.

Figure 44:
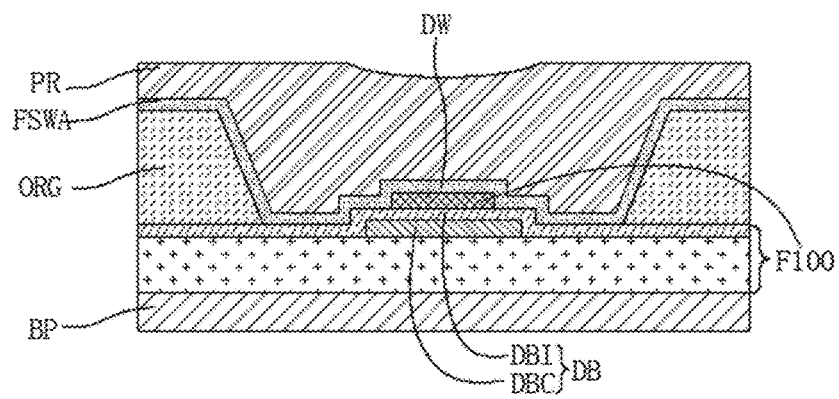
FIG. 44 shows a structural view of coating photoresist on a side of a conductive material layer away from a base substrate in an embodiment of the present disclosure.

Step S333, as shown in FIG. 44, photoresist PR is coated on a side of conductive material layer FSWA away from the base substrate BP, and the photoresist PR fills the barrier groove BG. As shown in FIG. 44, due to a raising effect of the second pillow body DB, a thickness of the photoresist PR above the second pillow body DB decreases.

Figure 45:
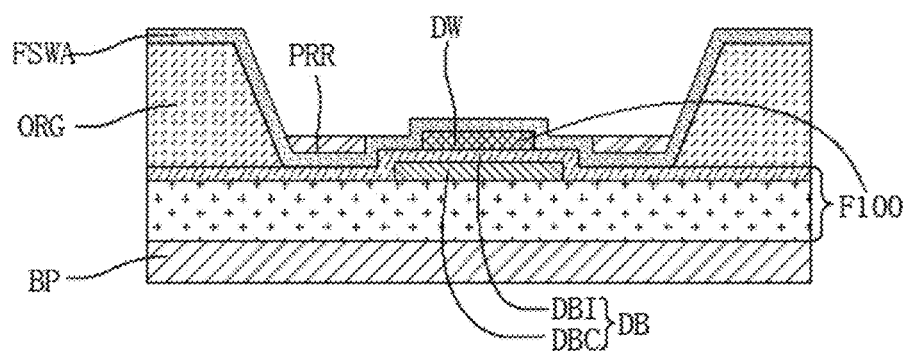
FIG. 45 shows a structural view of insufficient photoresist exposure in a barrier groove in an embodiment of the present disclosure.

Step S334, as shown in FIG. 45, the photoresist PR is exposed and developed. A thickness of the photoresist PR decreases at a part raised by the second pillow body DB in the barrier groove BG. Thus, the photoresist PR is fully exposed, and the residue less likely appears. A residual photoresist PRR may appear between the edge of the second pillow body DB and the edge of the barrier groove BG, and the residual photoresist cannot cover the second pillow body DB.

Figure 46:
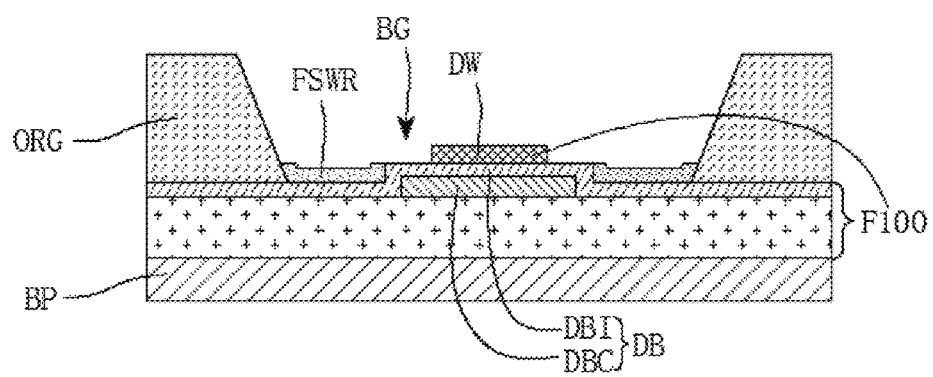
FIG. 46 shows a structural view of insufficient etching of a conductive material layer in Sa barrier groove in an embodiment of the present disclosure, in which a residual conductive material is not connected to a conductive structure.

Step S335, removing the photoresist after etching the conductive material layer FSWA to form a required structure and form the conductive layer FSW. In this process, as shown in FIG. 46, the conductive material between the edge of the barrier groove BG and the second pillow body DB is not fully etched due to the shield of the residual photoresist, such that there is a residual conductive material FSWR between the edge of the barrier groove BG and the second pillow body DB. However, the residual conductive material FSWR and the conductive structure DW are separated by the second pillow body DB, thus avoiding the short circuit between the conductive structures DW caused by the residual conductive material FSWR.

Figure 48:
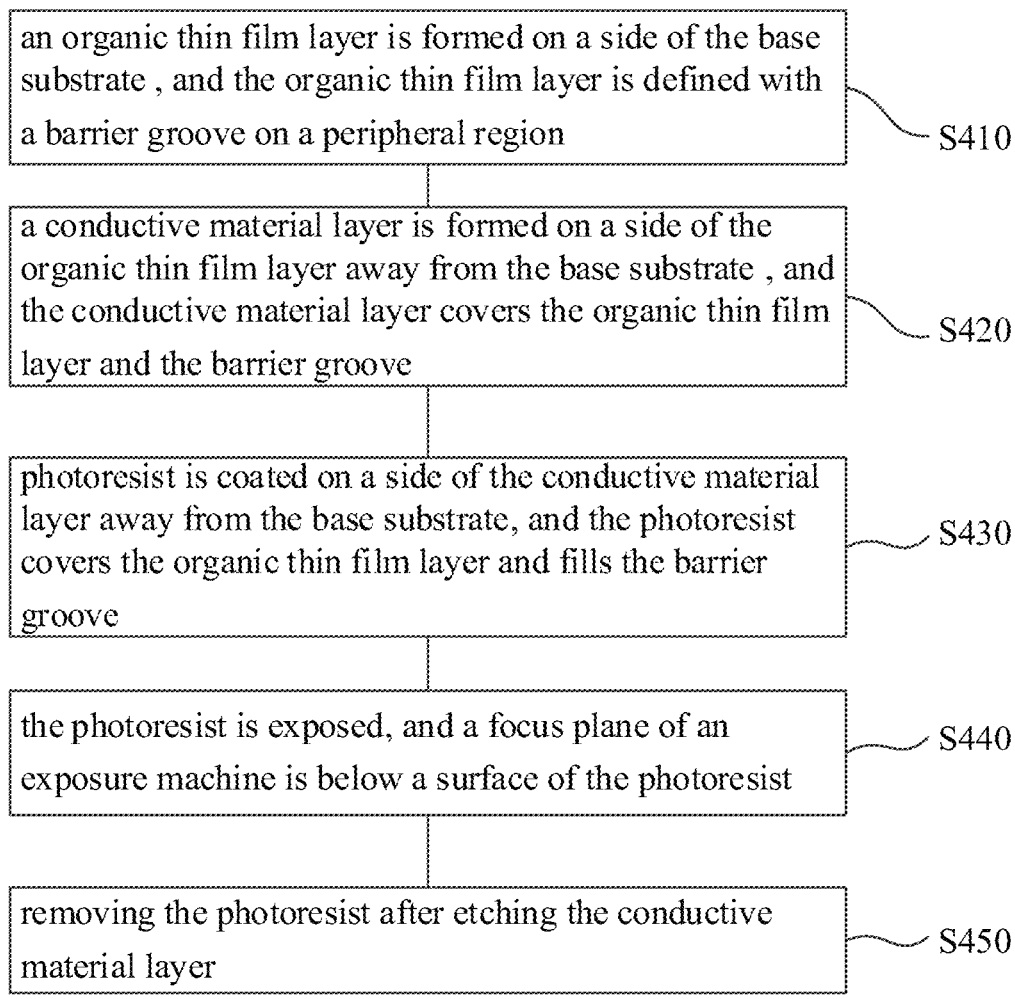
FIG. 48 shows a flow diagram of a method for preparing an array substrate in an embodiment of the present disclosure.

To solve such the short-circuit defect, as shown in FIG. 48, in a fourth solution provided by the embodiment of the present disclosure, the preparation method shown in steps S410 to S450 below may be adopted to prepare the array substrate ARR according to the embodiment of the present disclosure.

Figure 49:
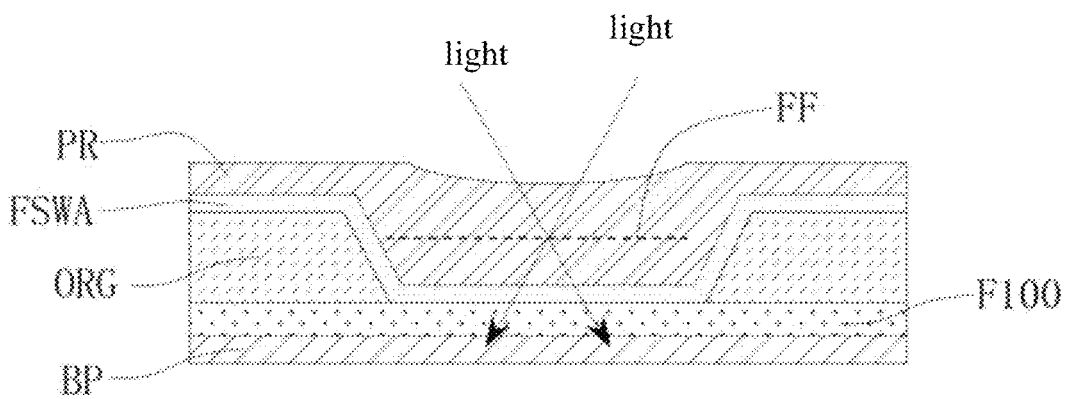
FIG. 49 shows a structural view of a focus plane located inside a photoresist during exposure in an embodiment of the present disclosure.
Figure 50:
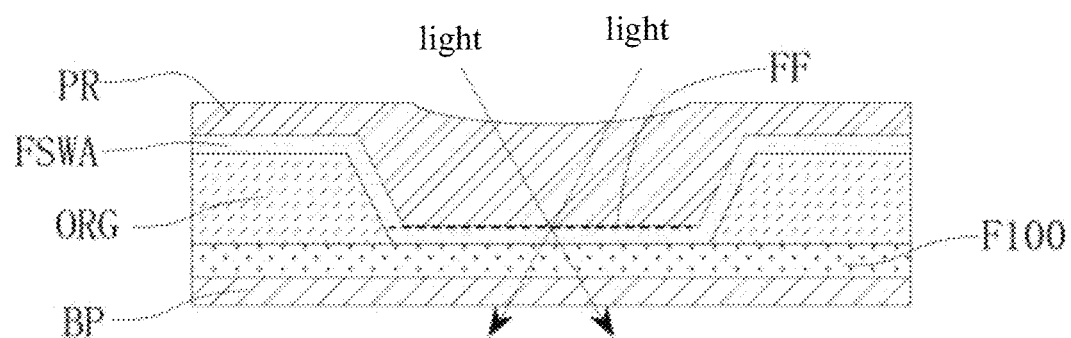
FIG. 50 shows a structural view of a focus plane located on a lower surface of a photoresist during exposure in an embodiment of the present disclosure.
Figure 51:
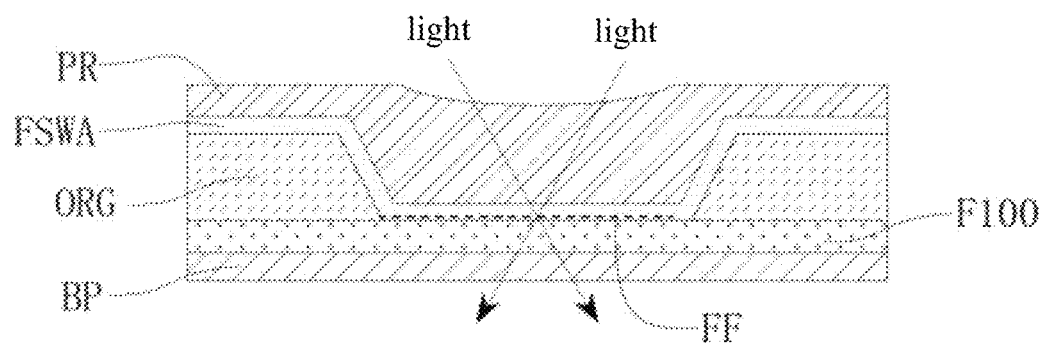
FIG. 51 shows a structural view of a focus plane located below a lower surface of a photoresist during exposure in an embodiment of the present disclosure.

Step S410, as shown in FIG. 49 to FIG. 51, an organic thin film layer ORG is prepared on a side of the base substrate BP, and the organic thin film layer ORG is defined with a barrier groove BG on a peripheral region BB.

Step S420, as shown in FIG. 49 to FIG. 51, a conductive material layer FSWA is prepared on a side of the organic thin film layer ORG away from the base substrate BP, and the conductive material layer FSWA covers the organic thin film layer ORG and the barrier groove BG.

Step S430, as shown in FIGS. 49 to 51, photoresist PR is coated on a side of the conductive material layer FSWA away from the base substrate BP, and the photoresist PR covers the organic thin film layer ORG and fills the barrier groove BG.

Step S440, as shown in FIG. 49 to FIG. 51 the photoresist PR is exposed, and a focus plane FF of an exposure machine is below a surface of the photoresist PR.

Step S450: removing the photoresist after etching the conductive material layer FSWA.

Figure 47:
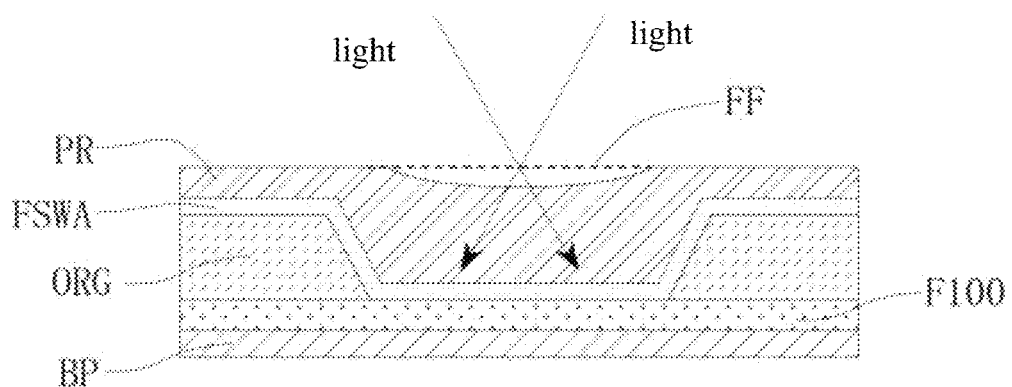
FIG. 47 shows a structural view of a focus plane located on a surface of a photoresist during exposure in the related art.

As shown in FIG. 47, in the related art, the focus plane FF of the exposure machine is usually on an upper surface of the photoresist (a surface away from the base substrate BP). In the preparation method according to the embodiment of the present disclosure, the focus plane FF of the exposure machine is moved downwardly, which may improve the exposure degree of the photoresist PR at a bottom of the barrier groove BG, and thus fully expose the photoresist PR at the bottom of the barrier groove BG without increasing the exposure intensity (such as increasing the exposure light intensity or extending the exposure time). Moreover, a pattern of shallow photoresist (such as the photoresist on the organic thin film layer ORG) is not adversely affected. In this way, by fully exposing the photoresist PR at the bottom of the barrier groove BG, accuracy of the pattern is improved after the photoresist is developed, thereby improving accuracy of a patterned pattern of the conductive material layer FSWA, reducing or avoiding an non-designed conductive material from being left in the barrier groove BG after the conductive material layer FSWA is patterned, and further avoiding the short-circuit defects in the barrier groove BG.

In an example, in step S450, as shown in FIG. 49, in the barrier groove BG, a distance between the focus plane FF of the exposure machine and the bottom of the barrier groove BG is equal to or less than half of a maximum thickness of the photoresist in the barrier groove BG, so as to ensure full exposure of the photoresist at the bottom of the barrier groove BG.

In another example, in step S450, as shown in FIG. 50 or FIG. 51, in the barrier groove BG, the focus plane FF of the exposure machine is adjacent to or below a bottom surface of the photoresist, which facilitates the design of a mask used for exposure.

In this embodiment, the driving circuit layer F100 may be located on a side of the conductive material layer FSWA away from the base substrate BP, or between the conductive material layer FSWA and the base substrate BP, which is not limited in the present disclosure. In the example of FIGS. 49 to 51, the driving circuit layer F100 is located between the conductive material layer FSWA and the base substrate BP. Then, before step S410, the driving circuit layer F100 may be prepared on the base substrate BP, and then the organic thin film layer ORG and the conductive material layer FSWA may be prepared on the side of the driving circuit layer F100 away from the base substrate BP. In other embodiments of the present disclosure, the organic thin film layer ORG and the conductive material layer FSWA may be prepared first, for example, the pixel electrode or the common electrode of the array substrate ARR may be prepared first, and then the driving circuit layer F100 may be prepared.

In an embodiment of the present disclosure, the display panel PNL also includes a cover plate CF arranged opposite to the array substrate ARR to form a cell, and a frame sealant provided between the array substrate ARR and the cover plate CF. The frame sealant covers the barrier groove BG. The driving circuit layer F100 is provided with a conductive wire overlapping with the frame sealant on the peripheral region BB, and the conductive wire is designed in a grid manner.

The embodiment of the present disclosure also provides a display device, which includes any one of the display panels described in the display panel embodiments. The display device may be a smart phone screen, a smart watch screen or other types of display devices. Since the display device is provided with any one of the display panels described in the above display panel embodiments, it has the same beneficial effect, which will not be repeated herein.

In an embodiment of the present disclosure, as shown in FIG. 1, the display panel PNL is a liquid crystal display panel, and the display device also includes a backlight module BLU on a backlight surface of the liquid crystal display panel. In this way, the display device is a transmissive liquid crystal display device.

It should be noted that although the various steps of the preparation method of the array substrate of the present disclosure are described in a particular order in the drawings, this does not require or imply that the steps must be performed in that particular order, or that all illustrated steps must be performed in order to achieve the desired result. Additionally or alternatively, certain steps may be omitted, multiple steps may be combined into one step for execution, and/or one step may be decomposed into multiple steps for execution.

Those skilled in the art will readily contemplate other embodiments of the present disclosure after considering the specification and practicing the invention disclosed herein. This application is intended to cover any variations, uses, or adaptations of the present disclosure that conform to the general principles of the disclosure and include the common general knowledge or conventional technical means in the technical field not disclosed by the disclosure. It is intended that the specification and examples be considered as exemplary only, with a true scope and spirit of the disclosure being indicated by the appended claims.

What is claimed is:

1. An array substrate comprising a base substrate, a driving circuit layer, an organic thin film layer and a conductive layer sequentially stacked;
   wherein the driving circuit layer is provided with a first pillow body on a peripheral region of the array substrate; the first pillow body comprises a first pillow metal block located on at least one of a source drain metal layer and a gate layer and a first pillow insulating layer covering the first pillow metal block;
   the organic thin film layer is defined with a barrier groove on the peripheral region, a part of the first pillow body is covered by the organic thin film layer and the other part of the first pillow body is exposed by the barrier groove;
   the conductive layer is provided with a signal wire passing across an edge of the barrier groove, and an edge of the signal wire at least partially overlaps the first pillow body.

2. The array substrate according to claim 1, wherein in at least a partial region of the barrier groove, two edges of the barrier groove are provided with a plurality of the first pillow bodies including the first pillow body, respectively;
   each of two edges of a same signal wire being the signal wire overlaps two adjacent first pillow bodies, and the signal wire covers a gap between the two adjacent first pillow bodies.

3. The array substrate according to claim 1, wherein in at least a partial region of the barrier groove, each of two edges of the barrier groove is provided with one first pillow body being the first pillow body, and the signal wire intersects with the first pillow body.

4. The array substrate according to claim 1, wherein in at least a partial region of the barrier groove, a plurality of first pillow bodies including the first pillow body are provided; two ends of any one of the first pillow bodies are covered by the organic thin film layers at two sides of the barrier groove, respectively; each of two edges of the signal wire at least partially overlaps with two adjacent first pillow bodies, and the signal wire covers a gap between the two adjacent first pillow bodies.

5. The array substrate according to claim 1, wherein in at least a partial region of the barrier groove, there is one first pillow body being the first pillow body and two ends of the first pillow body are covered by the organic thin film layers at two sides of the barrier groove, respectively; a part of the signal wire on a bottom surface of the barrier groove is at least partially carried on the first pillow body.

6. The array substrate according to claim 1, wherein the driving circuit layer is provided with a ground wire on the peripheral region, and the ground wire at least partially overlaps the barrier groove;
   at least a part of the first pillow metal block is a part of the ground wire.

7. The array substrate according to claim 1, wherein the driving circuit layer is provided with a ground wire on the peripheral region, and the ground wire at least partially overlaps with the barrier groove;
   a position of the signal wire passing across the edge of the barrier groove does not overlap the ground wire.

8. The array substrate according to claim 1, wherein a size of the part of the first pillow body covered by the organic thin film layer is not less than 2 microns along an extension direction perpendicular to the barrier groove.

9. The array substrate according to claim 1, wherein a height of the first pillow body protruding from a bottom of the barrier groove is greater than or equal to 10% of a depth of the barrier groove.

10. A method for preparing an array substrate, comprising:
    forming a driving circuit layer on a side of a base substrate, wherein the driving circuit layer is provided with a first pillow body on a peripheral region of the array substrate; the first pillow body comprises a first pillow metal block located on at least one of a source drain metal layer and a gate layer and a first pillow insulating layer covering the first pillow metal block;
    sequentially forming an organic thin film layer and a conductive layer on a side of the driving circuit layer away from the base substrate; wherein the organic thin film layer is defined with a barrier groove on the peripheral region, a part of the first pillow body is covered by the organic thin film layer and the other part of the first pillow body is exposed by the barrier groove; the conductive layer is provided with a signal wire passing across an edge of the barrier groove, and an edge of the signal wire at least partially overlaps the first pillow body.

11. The method for preparing the array substrate according to claim 10, wherein in at least a partial region of the barrier groove, two edges of the barrier groove are provided with a plurality of the first pillow bodies including the first pillow body, respectively;
    each of two edges of a same signal wire being the signal wire overlaps two adjacent first pillow bodies, and the signal wire covers a gap between the two adjacent first pillow bodies.

12. The method for preparing the array substrate according to claim 10, wherein in at least a partial region of the barrier groove, each of two edges of the barrier groove is provided with one first pillow body being the first pillow body, and the signal wire intersects with the first pillow body.

13. The method for preparing the array substrate according to claim 10, wherein in at least a partial region of the barrier groove, there is a plurality of first pillow bodies including the first pillow body; two ends of any one of the first pillow bodies are covered by the organic thin film layers at two sides of the barrier groove, respectively; each of two edges of the signal wire at least partially overlaps with two adjacent first pillow bodies, and the signal wire covers a gap between the two adjacent first pillow bodies.

14. The method for preparing the array substrate according to claim 10, in at least a partial region of the barrier groove, there is one first pillow body being the first pillow body and two ends of the first pillow body are covered by the organic thin film layers at two sides of the barrier groove, respectively; a part of the signal wire on a bottom surface of the barrier groove is at least partially carried on the first pillow body.

15. A display panel, comprising an array substrate; wherein the array substrate comprises a base substrate, a driving circuit layer, an organic thin film layer and a conductive layer sequentially stacked;
    wherein the driving circuit layer is provided with a first pillow body on a peripheral region of the array substrate; the first pillow body comprises a first pillow metal block located on at least one of a source drain metal layer and a gate layer and a first pillow insulating layer covering the first pillow metal block;

the organic thin film layer is defined with a barrier groove on the peripheral region, a part of the first pillow body is covered by the organic thin film layer and the other part of the first pillow body is exposed by the barrier groove;

a conductive layer is provided with a signal wire passing across an edge of the barrier groove, and an edge of the signal wire at least partially overlaps the first pillow body.

16. The display panel according to claim 15, wherein the display panel further comprises a cover plate opposite to the array substrate, and a frame sealant provided between the array substrate and the cover plate; the frame sealant covers the barrier groove;

the driving circuit layer is provided with a conductive wire overlapping the frame sealant on the peripheral region, and the conductive wire is designed in a grid manner.

17. The display panel according to claim 15, wherein in at least a partial region of the barrier groove, two edges of the barrier groove are provided with a plurality of the first pillow bodies including the first pillow body, respectively;

each of two edges of a same signal wire being the signal wire overlaps two adjacent first pillow bodies, and the signal wire covers a gap between the two adjacent first pillow bodies.

18. The display panel according to claim 15, wherein in at least a partial region of the barrier groove, each of two edges of the barrier groove is provided with one first pillow body being the first pillow body, and the signal wire intersects with the first pillow body.

19. The display panel according to claim 15, wherein in at least a partial region of the barrier groove, there is a plurality of first pillow bodies including the first pillow body; two ends of any one of the first pillow bodies are covered by the organic thin film layers at two sides of the barrier groove, respectively; each of two edges of the signal wire at least partially overlaps with two adjacent first pillow bodies, and the signal wire covers a gap between the two adjacent first pillow bodies.

20. The display panel according to claim 15, wherein in at least a partial region of the barrier groove, there is one first pillow body being the first pillow body and two ends of the first pillow body are covered by the organic thin film layers at two sides of the barrier groove, respectively; a part of the signal wire on a bottom surface of the barrier groove is at least partially carried on the first pillow body.

* * * * *